United States Patent
Saito et al.

(10) Patent No.: US 6,590,803 B2
(45) Date of Patent: Jul. 8, 2003

(54) MAGNETIC MEMORY DEVICE

(75) Inventors: Yoshiaki Saito, Kawasaki (JP);
Kentaro Nakajima, Tokyo (JP);
Masayuki Sagoi, Yokohama (JP);
Minoru Amano, Kawasaki (JP);
Shigeki Takahashi, Yokohama (JP);
Tatsuya Kishi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/102,634

(22) Filed: Mar. 22, 2002

(65) Prior Publication Data

US 2002/0141232 A1 Oct. 3, 2002

(30) Foreign Application Priority Data

Mar. 27, 2001 (JP) .................................. 2001-090768
Mar. 29, 2001 (JP) .................................. 2001-095976

(51) Int. Cl.$^7$ .............................................. G11C 11/00
(52) U.S. Cl. ........................ 365/158; 365/171; 365/173
(58) Field of Search ................................ 365/158, 171, 365/173, 189.01, 230.06, 55, 66, 213

(56) References Cited

U.S. PATENT DOCUMENTS

| | | | |
|---|---|---|---|
| 5,640,343 A | | 6/1997 | Gallagher et al. |
| 5,659,499 A | | 8/1997 | Chen et al. |
| 5,729,410 A | | 3/1998 | Fontana, Jr. et al. |
| 5,734,605 A | | 3/1998 | Zhu et al. |
| 5,852,574 A | * | 12/1998 | Naji ............................ 365/158 |
| 5,940,319 A | | 8/1999 | Durlam et al. |
| 5,966,012 A | | 10/1999 | Parkin |
| 6,005,800 A | | 12/1999 | Koch et al. |
| 6,104,633 A | | 8/2000 | Abraham et al. |

FOREIGN PATENT DOCUMENTS

| | | |
|---|---|---|
| JP | 9-260743 | 10/1997 |
| JP | 10-4227 | 1/1998 |
| WO | WO 00/10172 | 2/2000 |

OTHER PUBLICATIONS

Jagadeesh S. Moodera, et al., "Ferromagnetic–Insulator–Ferromagnetic Tunneling: Spin–Dependent Tunneling and Large Magnetoresistance in Trilayer Junctions (Invited)", J. Appl. Phys. vol. 79, No. 8, Apr. 15, 1996, pp. 4724–4729.

Y. Saito, et al., "Spin–Dependent Tunneling Through Layered Hard–Magnetic Nano–Particles", J. Magnetic Soc. Jpn. vol. 23, No. 4–2, 1999, pp. 1269–1272.

F. Montaigne, et al., "Enhanced Tunnel Magnetoresistance at High Bias Voltage in Double–Barrier Planar Junctions", Applied Physics Letters, vol. 73, No. 19, Nov. 9, 1998, pp. 2829–2831.

L. F. Schelp, et al., "Spin–Dependent Tunneling with Coulomb Blockade", Physical Review B, vol. 56, No. 10, Sep. 1, 1997, pp. R5747–R5750.

* cited by examiner

Primary Examiner—David Lam
(74) Attorney, Agent, or Firm—Oblon, Spivak, McClelland, Maier & Neustadt, P.C.

(57) ABSTRACT

A magnetic memory device includes a plurality of magnetoresistive elements arranged on a first plane in a matrix form, a plurality of first writing lines which are arranged on a second plane different from the first plane adjacent to the magnetoresistive elements, a first address decoder which selects a desired one from the plurality of first writing lines, a plurality of second writing lines crossing the plurality of first writing lines on a third plane different from the second plane and having parts adjacent to the plurality of magnetoresistive elements on the second plane and parallel to the plurality of first writing lines, and a second address decoder which selects a desired one from the plurality of second writing lines.

20 Claims, 21 Drawing Sheets

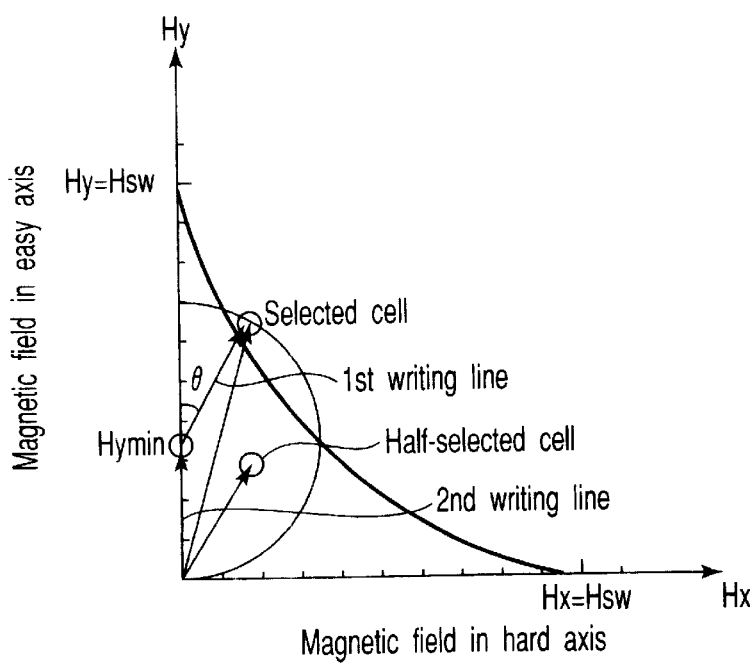
F I G. 4B

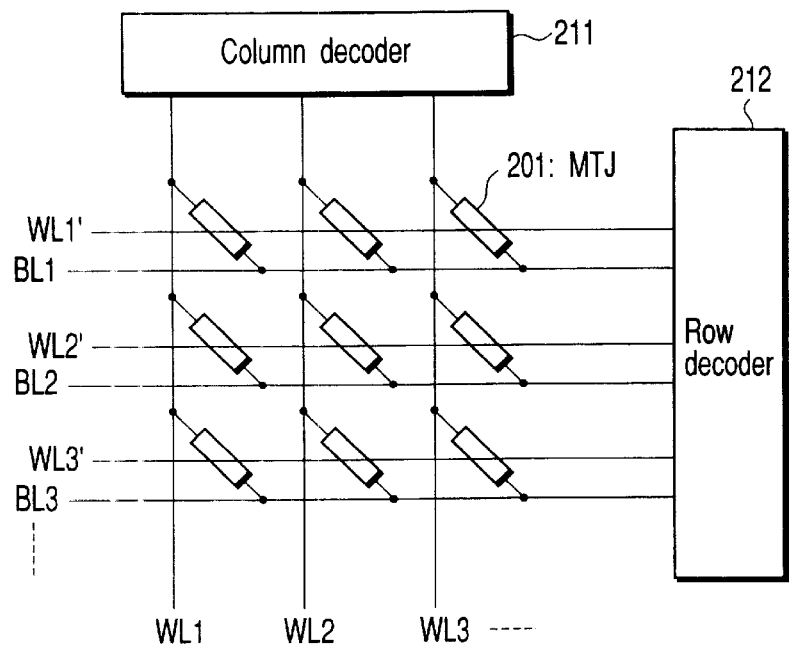
F I G. 14
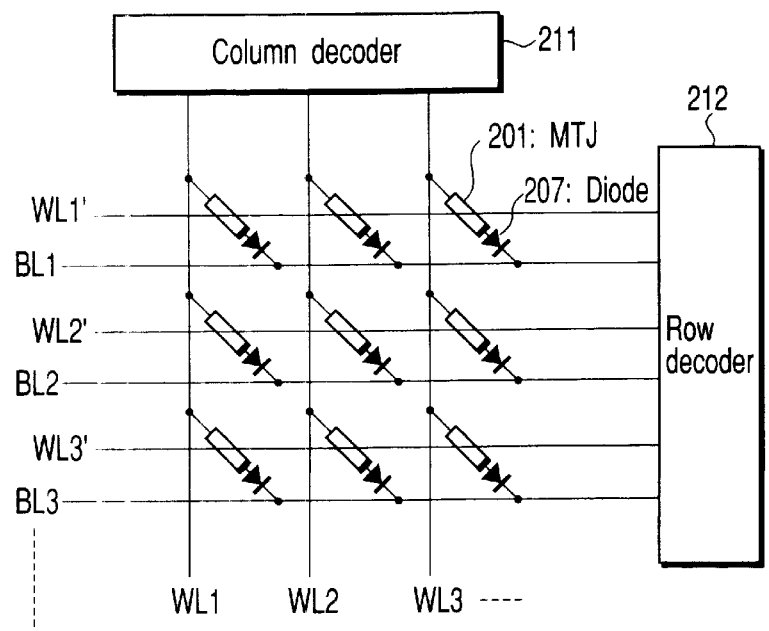
F I G. 15

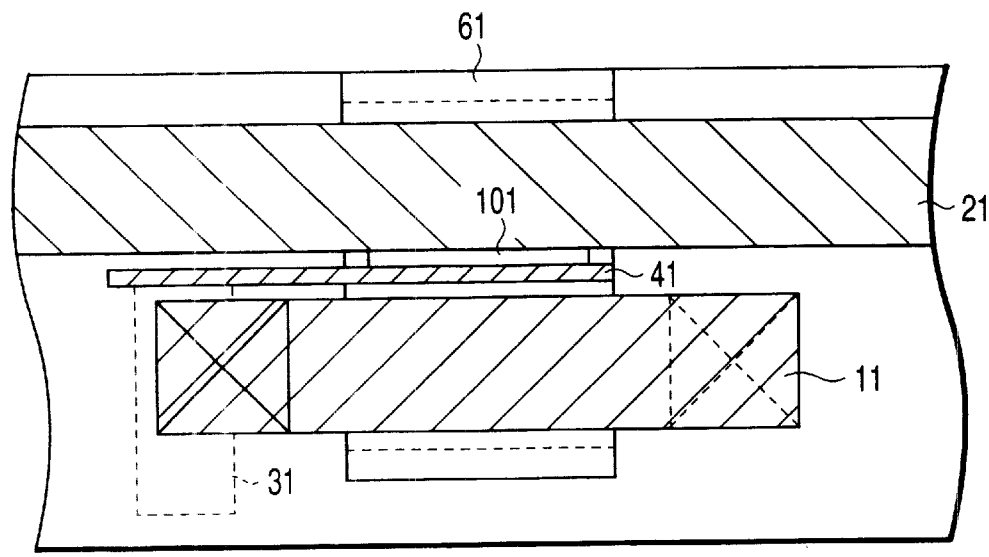
F I G. 22A
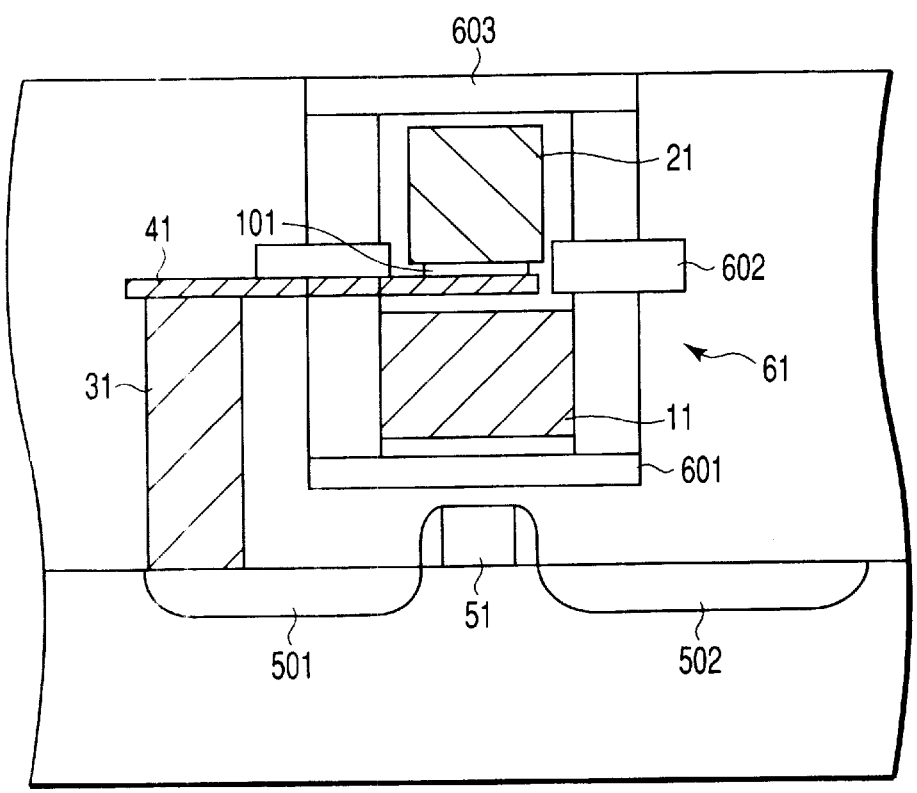
F I G. 22B

MAGNETIC MEMORY DEVICE

CROSS-REFERENCE TO RELATED APPLICATIONS

This application is based upon and claims the benefit of priority from the prior Japanese Patent Applications No. 2001-090768, filed Mar. 27, 2001; No. 2001-095976, filed Mar. 29, 2001, the entire contents of both of which are incorporated herein by reference.

BACKGROUND OF THE INVENTION

1. Field of the Invention

The present invention relates to a magnetic memory device using a ferromagnetic material, and more particularly to a non-volatile solid-state memory utilizing a ferromagnetic tunneling junction (MTJ).

2. Description of the Related Art

In recent years, in a sandwich film in which one layer of a dielectric body is inserted between two magnetic metallic layers, there has been discovered a magnetoresistive element which can read a change in resistance by passing a tunneling current to a film surface in the vertical direction and utilizing this tunneling current, which is a so-called MTJ element (Magnetic Tunnel Junction element).

In regard to the ferromagnetic tunneling junction, there has been reported the fact that a rate of change in magnetoresistance which is not less than 20% can be obtained (see J. Appl. Phys. 79,4724 (1996), for example). Therefore, the possibility of application to a magnetic head or a magnetic random access memory (MRAM) has been increased (see U.S. Pat. No. 5,640,343, and U.S. Pat. No. 5,734,605). This ferromagnetic tunneling junction forms a tunneling barrier layer comprising $AlO_x$ by forming a film of a thin Al layer having a thickness of 0.4 nm to 2.0 nm on a ferromagnetic electrode and then exposing its surface to pure oxygen or oxygen glow discharge or oxygen radical.

Further, there is proposed a ferromagnetic single tunneling junction having a structure in which an antiferromagnetic layer is given to one ferromagnetic layer of the ferromagnetic single tunneling junction and that ferromagnetic layer is determined as a magnetically pinned layer (see Jpn. Pat. Appln. KOKAI Publication No. 10-4227). This ferromagnetic tunneling junction element (ferromagnetic single tunneling junction), however, likewise has a problem that the rate of change in the magnetoresistance (MR ratio) is greatly reduced when the value of the voltage to be applied to the ferromagnetic tunneling junction element is increased in order to obtain a desired output voltage value.

Furthermore, there is proposed a ferromagnetic tunneling junction having magnetic particles dispersed in a dielectric body or a ferromagnetic double tunneling junction (see Jpn. Pat. Appln. KOKAI Publication No. 9-260743, Phys. Rev. B 56(10), R5747 (1997), Journal of the Magnetic Society of Japan 23, 4-2, (1999), Appl. Phys. Lett. 73(19), 2829 (1998)). In these junctions, since the rate of change in the magnetoresistance which is not less than 20% can be obtained, the possibility of application to a magnetic head or a magnetoresistive memory device has emerged.

In these ferromagnetic double tunneling junctions, since reduction in the MR ration involved by a bias voltage is small as compared with the ferromagnetic single tunneling junction, they have a characteristic that a large output can be obtained.

A magnetic memory element using the ferromagnetic single or double tunneling junction is non-volatile, and a writing/reading time is as fast as 10 nsec or below. It has a potential ability that a number of times of rewriting is not less than $10^{15}$ and a cell size can be reduced as small as a DRAM (Dynamic Random Access Memory).

In particular, the magnetic memory element using the ferromagnetic double tunneling junction can suppress reduction in the rate of change in the magnetoresistance even if a value of a voltage to be applied to the ferromagnetic tunneling junction element is increased in order to obtain a desired output voltage value as described above, and hence a large output voltage can be assured, thereby demonstrating a characteristic which is preferable as the magnetic memory element.

However, since the magnetic memory element using the ferromagnetic single or double tunneling junction utilizes a ferromagnetic material, it has a problem that power consumption at the time of writing is large when a memory capacity is increased and a cell width of the ferromagnetic tunneling junction is decreased, as compared with a competing memory such as a FeRAM (Ferroelectric Random Access Memory), a flash memory or the like.

When a switching magnetic field is increased, not only power consumption during writing is increased, but also the density of an electric current caused to flow to a word line and a bit line in order to invert a spin is increased and a problem of EM (Electro-Migration) occurs when the high density of an MRAM (Magnetic Random Access Memory) is realized and the design rule is minimized.

Based on a result of the electromagnetic field simulation for an electromagnetic field distribution and the intensity in a direction within an MTJ cell plane when the design rule is 0.1 $\mu$m, it can be understood that the intensity of the electromagnetic field is the order of 10 Oersted (Oe) at the highest even in cases where the density of the electric current caused to flow to wirings is assumed to be $5 \times 10^6$ $A/cm^2$.

Furthermore, when the capacity of the MRAM is approximately 1 Gbit and a distance between adjacent cells is approximately 0.1 $\mu$m, the magnetic field applied to the adjacent cells becomes approximately 80% of the magnetic field applied to cells on the wirings, and there may occur a problem of the interference between cells, i.e., so-called crosstalk.

In order to solve the problem of crosstalk, there is proposed changing a direction of a magnetization easy axis between the adjacent cells to a different direction (see U.S. Pat. No. 6,005,800). The shape of cells must be formed without irregularities in order to use this method. However, when the capacity of the MRAM is increased and the cell size is reduced, the forming accuracy is hard to be controlled, and there are irregularities in the switching magnetic field of cells, which results in a problem that the crosstalk can be hardly eliminated.

Moreover, the size of the switching magnetic field depends on a cell size of the MTJ, a cell shape, a magnetization characteristic of a material, a film thickness or the like. For example, when the cell size of the MTJ becomes small as described above, the switching magnetic field of the spin is increased due to the influence of the demagnetizing field.

As to the cell shape, a magnetic domain is produced at an end portion in case of a rectangular cell shape, the remanence is decreased, and the step-like Barkhausen jump occurs. In addition, variations are generated in the switching magnetic field depending on how the magnetic domain is produced. When the cell shape is elliptical, a single domain structure can be obtained and the MR ratio is not lowered. However, there is a problem of a large degree of the increase in the switching magnetic field as a function of the reduction in the cell width.

Additionally, in order to solve these problems, there are proposed a structure characterized in that a magnetic memory cell is provided at a part where bit and word lines cross each other substantially at right angles and shape of the cell is asymmetric with respect to the magnetization easy axis, and a structure in which the easy axis is somewhat inclined from the direction of wirings (see U.S. Pat. No. 6,104,633).

As to the shape control, however, when the density of the MRAM is increased and the cell size is reduced as described above, the forming accuracy can not be disadvantageously controlled, and irregularities are generated in the switching magnetic field of the cell.

Further, in the structure having the easy axis of the cell being somewhat inclined from the direction of wirings, the switching magnetic field is reduced, but the problem of crosstalk becomes serious when the density is increased.

In order to solve these problems (increase in the switching magnetic field involved by crosstalk and reduction in the cell width), it can be considered that the magnetic shield must be provided to the wirings (see U.S. Pat. No. 5,659,499, U.S. Pat. No. 5,940,319, and WO 200010172). When the magnetic shield is provided to the wirings, not only a value of the electromagnetic field is increased but also the problem of crosstalk can be solved.

Assuming that the cross-sectional aspect ratio of the bit line and the word line is 1:2 and distances between the bit line and a recording layer and between the word line and the recording layer are 10 nm and 50 nm, respectively and that the density of the electric current caused to flow to them is $2.5 \times 10^6$ A/cm$^2$ which is a realistic value, the current magnetic field generated in the MTJ cell is 87 Oersted (Oe). However, when the cell width is determined to be not more than 0.1 $\mu$m by using CogoFe$_{10}$ which is softest in Co—Fe having the large MR ratio, the switching magnetic field reaches approximately 200 Oersted (Oe), and a further new cell structure and a memory structure are required in order to realize a 1 Gbit MRAM.

Furthermore, in case of using the ferromagnetic tunneling junction as a magnetic head material for HDD (Hard Disk Driver), there is proposed a structure in which a hard bias layer is provided adjacent to the ferromagnetic tunneling junction in order to reduce the Barkhausen noise (see U.S. Pat. No. 5,729,410, and U.S. Pat. No. 5,966,012). However, using the hard bias layer is not preferable for reducing the switching magnetic field.

As described above, when the density of the MRAM is increased, the MRAM has a problem of large power consumption during writing, a problem of crosstalk and a problem of electromigration (EM) as compared with competing memories such as a FeRAM, a flash memory and the like.

Therefore, there is desired realization of a magnetic memory device having a memory structure and a wiring structure which can reduce power consumption during writing and does not have a problem or crosstalk or EM.

BRIEF SUMMARY OF THE INVENTION

According to a first aspect of the present invention, there is provided a magnetic memory device comprising:

a plurality of magnetoresistive elements arranged on a first plane in rows and columns;

a plurality of first writing lines arranged on a second plane different from the first plane adjacent to the magnetoresistive elements, respectively;

a first address decoder which selects a desired one from a plurality of the first writing lines;

a plurality of second writing lines crossing the plurality of first writing lines on a third plane different from the second plane and having parts adjacent to the plurality of magnetoresistive elements and parallel to the plurality of first writing lines; and a second address decoder which selects a desired one from the plurality of second writing lines.

According to a second aspect of the present invention, there is provided a magnetic memory device comprising:

a first writing line arranged on a first plane;

a second writing line arranged on a second plane different from the first plane and has a first part extended from one direction vertical to the first writing line, a second part connected to the first part at one end portion thereof and overlaps the first writing line, and a third part connected to the second part at the other end portion thereof, and extended vertically to the first writing line on an opposite side of the first part, the relationship of 2a>b>0 being obtained provided that a line width of the first and second writing lines is a and a shortest distance between a central line of the first part and a central line of the third part of the second writing line is b; and a magnetoresistive element sandwiched between the first writing line and the second part of the second writing line and connected to either the first writing line or the second writing line.

According to a third aspect of the present invention, there is provided a magnetic memory device comprising:

a plurality of ferromagnetic tunneling junction elements arranged on a first plane in a matrix form, each having at least two ferromagnetic layers including a magnetic recording layer and at least one tunneling barrier layer therebetween; and a plurality of soft magnetic bias layers provided at both ends of the plurality of ferromagnetic tunneling junction elements in a magnetization easy axial direction and having magnetism softer than the magnetic recording layer.

BRIEF DESCRIPTION OF THE SEVERAL VIEWS OF THE DRAWING

FIG. 4B is a view illustrating a cell selection principle during the writing operation in the first embodiment;

FIG. 14 is a circuit diagram showing an architecture of a magnetic memory device according to the sixth embodiment;

FIG. 15 is a circuit diagram showing an architecture of a magnetic memory device according to the seventh embodiment;

FIG. 22A is a cross-sectional view taken along the line 22A—22A in FIG. 21;

FIG. 22B is a cross-sectional view taken along the line 22B—22B in FIG. 21;

DETAILED DESCRIPTION OF THE INVENTION

Figure 1:
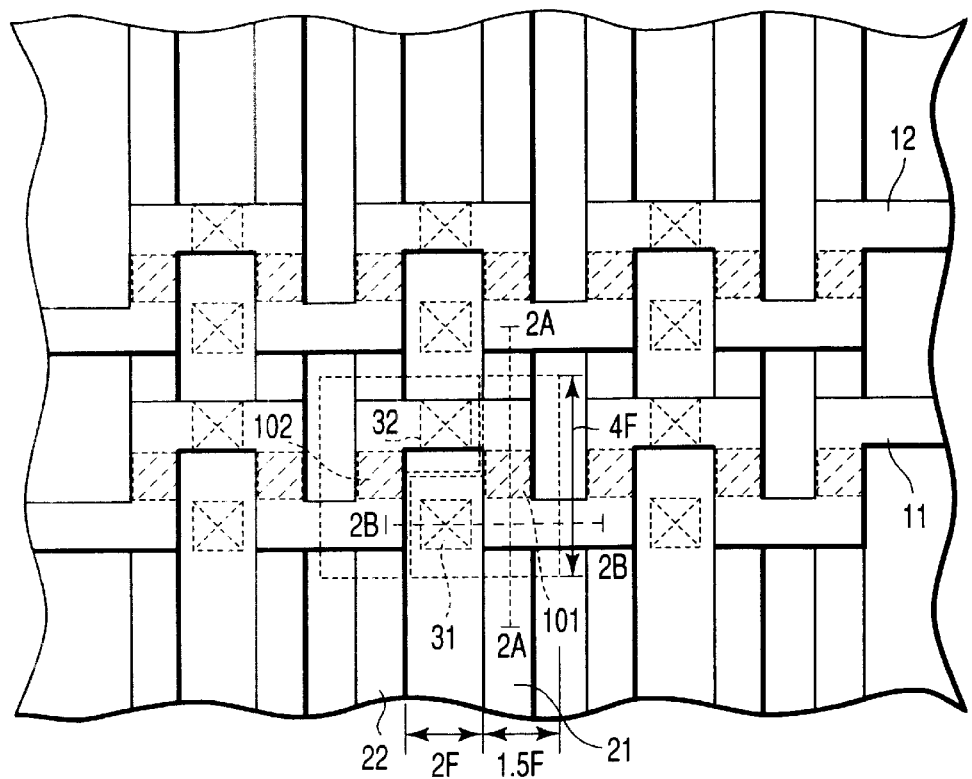
FIG. 1 is a schematic view showing a memory cell layout in a first embodiment according to the present invention.

A memory cell of an MRAM usually has a structure in which a plurality of ferromagnetic materials are laminated. Information is recorded by associating the fact that the relative arrangement of magnetization of a plurality of ferromagnetic materials constituting the memory cell is parallel or antiparallel with binary information "1" or "0". Recorded information is written by switching a direction of magnetization of the ferromagnetic materials of each cell by an electromagnetic field generated by causing an electric current to flow to writing lines arranged in the cross stripe form.

Power consumption when maintaining recorded information is zero in principle, and the memory is a non-volatile memory by which recorded information is maintained even if a power supply is turned off. Recorded information is read by utilizing a phenomenon that the electric resistance of the memory cell varies depending on a relative angle of the direction of magnetization of the ferromagnetic materials constituting the cell and a sense current or depending on a relative angle of magnetization between a plurality of ferromagnetic layers, i.e., a so-called magnetoresistive effect.

In order to develop the MRAM which has a degree of Gbit class integration, there are some problems to be solved. One of such problems is reduction in a writing current. In the conventionally proposed MRAM, the current is passed to wirings, and a resulting magnetic field is used to invert magnetization of a recording layer of the MTJ element.

Although the intensity of the magnetic field generated from the wirings varies depending on a current value of the wirings and a distance between the wiring and the MTJ element, it is approximately several Oe/mA in conventionally known report examples. Further, a magnetization inversion threshold value (which will be defined as a switching magnetic field Hsw hereinafter) of the recording layer of the MTJ element is increased in inverse proportion to a size of the MTJ element in the direction of the magnetization hard axis (which will be defined as a cell width w hereinafter), which is expressed as follows:

$$H_{SW} = H_{SW_0} + A/w \qquad (1)$$

where Hsw0 is a switching magnetic field of a bulk. Furthermore, A is a constant which depends on a shape, a material or the like of the cell, and a conventionally know value of A is 10 to 20 Oe $\mu$m.

Taking the reliability of the wiring into consideration, electromigration gives one restriction. The electromigration is accelerated with the wiring current density, and the current density upper limits in the Al—Cu wiring and the Cu wiring currently used in manufacture of LSI are approximately $10^6$ A/cm$^2$ and $10^7$ A/cm$^2$, respectively.

Considering manufacture by the rule of 0.1 μm required for realizing a degree of Gbit class integration, the upper limit of a value of the current which can flow to the wiring is approximately 1 mA even if the Cu wiring is used, and a value of the resulting magnetic field is approximately several Oe. On the other hand, the switching magnetic field of the MTJ whose size is approximately 0.1 μm is several tens of Oe or above in accordance with the expression (1). That is, the Gbit class MRAM is hardly realized with the current technology.

On the other hand, there is a problem of interference during writing between adjacent cells as another problem for development of the MRAM. That is, in the MRAM, a plurality of writing lines are arranged so as to be substantially orthogonal to each other, and they form a cross matrix. During the writing operation, two orthogonal writing lines are selected, and inversion of magnetization of the recording layer in the selected MTJ cell is thereby caused by a synthetic magnetic field generated at an intersection.

In this case, besides the selected cell, there is a half-selected cell which receives the magnetic field from either the vertical wiring or the horizontal wiring. Therefore, in order to prevent erroneous writing into the half-selected cell, a rewriting current value must be adjusted so as to invert the selected cell and not to invert the half-selected cell during the writing operation. In a large-scale array, since a distribution is generated in the switching magnetic field of the MTJ cells, an allowable range of the rewriting current value generally becomes very small.

As described above, in order to develop the Gbit class MRAM, the two major problems are: (1) increase in the magnetic field generation efficiency from the wiring; and (2) increase in the allowable range of the rewriting current value in order to avoid erroneous writing into the half-selected cell during the writing operation. However, there is not known a method which provides a structure suitable for the MTJ cell which is a vertical current element and solves the above two problems. The following embodiments provide a method which can solve such problems and realize a high-speed low-power-consumption magnetic memory device which has a recording capacity of not less than several Gbit.

Preferred embodiments according to the present invention will now be described hereinafter with reference to the accompanying drawings.

(First Embodiment)

Figure 2A:
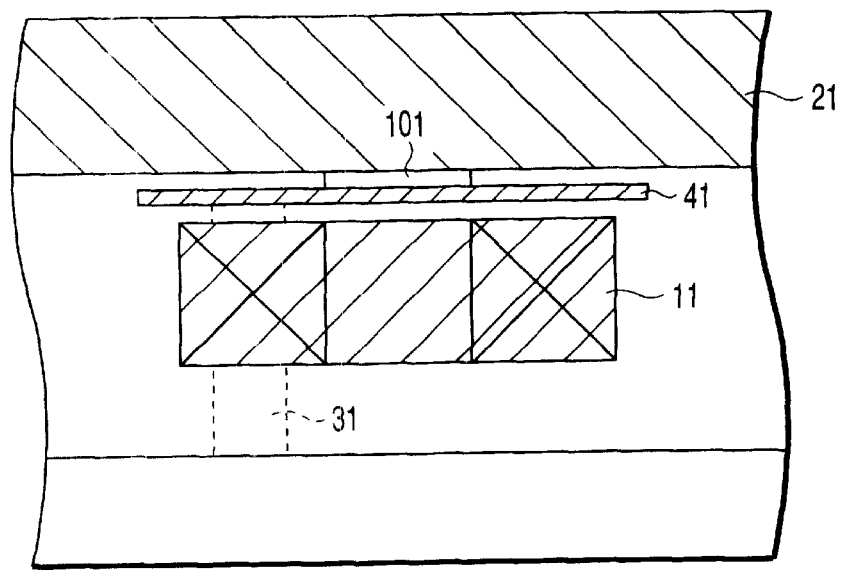
FIG. 2A is a cross-sectional view taken along the line 2A—2A in FIG. 1.
Figure 2B:
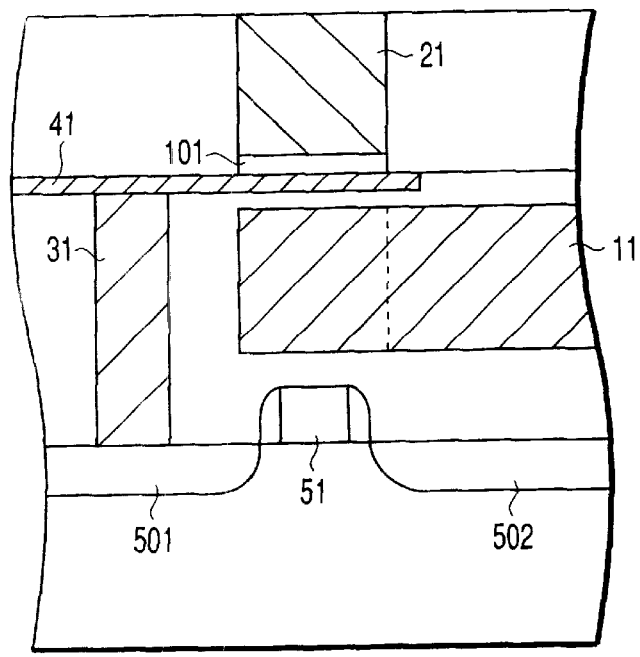
FIG. 2B is a cross-sectional view taken along the line 2B—2B in FIG. 1.

FIG. 1 is a plan view typically showing a cell layout according to a first embodiment of the present invention. Moreover, FIG. 2A is a cross-sectional view of a memory cell taken along the line 2A—2A of FIG. 1, and FIG. 2B is a cross-sectional view of the memory cell taken along the line 2B—2B of FIG. 1. It is to be noted that FIG. 1 is a bottom view seen from a substrate surface side (lower side) for facilitating understanding.

In FIG. 1, reference numerals 11 and 12 denote first writing lines; 21 and 22, second writing lines; 101 and 102, MTJ elements (cells); and 31 and 32, contact holes. In addition, in FIGS. 2A and 2B, reference numeral 41 designates a lower electrode; 501 and 502, diffusion areas of selected transistors; and 51, a word line of a selected transistor. The first writing lines and the second writing lines are electrically insulated. In addition, the second writing lines are electrically connected to the MTJ elements, and also serve as data lines.

As shown in FIG. 1, the memory cell in the magnetic memory device according to the first embodiment is mainly comprised of the first writing lines, the second writing lines and the MTJ cells. The first writing lines and the second writing lines are arranged on planes different from each other and configured to sandwich the MTJ cells in the direction vertical to the film surface. Incidentally, FIGS. 2A and 2B show the structure in which the second writing lines are provided in the upper layer of the first writing lines, but the reverse structure is also possible.

The first writing lines and the second writing lines are orthogonal to each other when taking a bird's eye view of them, and form the cross matrix. On the other hand, in the vicinity of an intersection, the first writing line and the second writing line run in parallel with each other. The first writing line runs parallel for a fixed length and then is bent at a right angle. As a result, the first writing line has a zigzag shape. The second writing line is straight in a memory array area.

The MTJ cell is arranged in an area where the first writing line and the second writing line run in parallel with each other. The direction of a magnetization easy axis of the MTJ cell is arranged vertically with respect to the second writing line running direction.

In the first embodiment, each of the first writing line and the second writing line is formed to have a width F (minimum line width in the design rule), and an area of the memory cell is $10F^2$.

Figure 3:
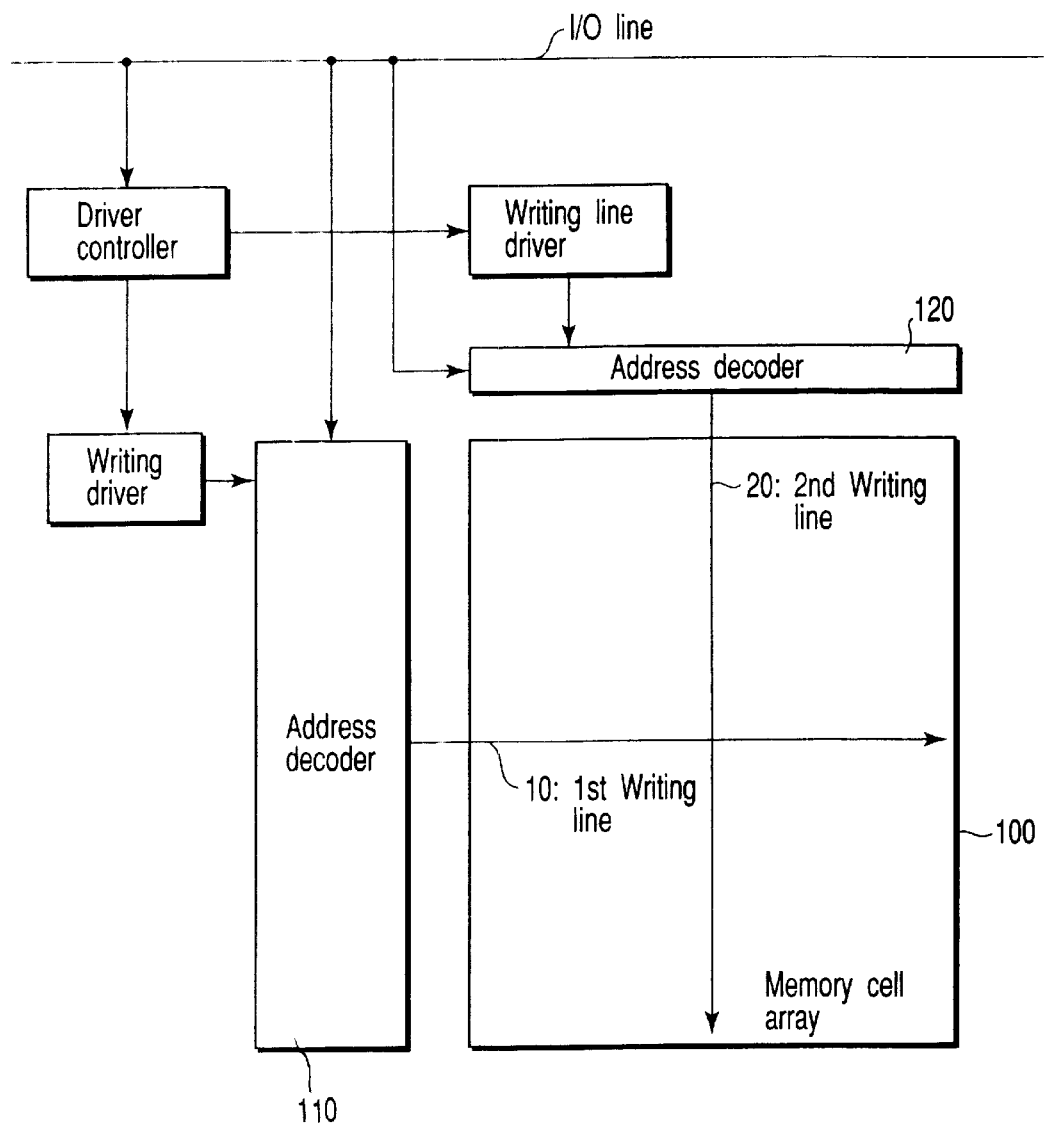
FIG. 3 is a block diagram typically showing a structure of a memory cell array in embodiments according to the present invention.

FIG. 3 typically shows the structure of a memory cell array 100 according to the embodiments of the present invention. In the memory cell array 100, the memory cells (MTJ cells) 101, 102 or the like are arranged in a matrix form.

As described above, the first writing lines 10 including 11, 12 or the like and the second writing lines 20 including 21, 22 or the like are substantially orthogonal to each other and connected to writing line drivers through address decoders 110 and 120. The two address decoders 110 and 120 are connected to an I/O line, respectively. As a result, a writing address with respect to an arbitrary memory cell can be designated by, for example, associating a higher part address and a lower part address in signals from the address buss of the I/O line with selection of the first and second writing lines.

It is preferable that the MTJ cell has a spin valve structure in which a single tunneling barrier, a pinned layer having ferromagnetic alloy or a multi-layer film including Fe, Ni and Co and at least one layer of an antiferromagnetic thin film such as PtMn being laminated is arranged on one side of the tunneling barrier and a recording layer comprised of ferromagnetic alloy including Fe, Ni and Co or a multi-layer film is arranged on the other side.

Additionally, when the MTJ cell has the dual spin valve structure, a further preferable conformation can be obtained because drop in the rate of change in the magnetoresistance relative to the element application voltage can be reduced and the withstanding voltage can be increased. The dual spin valve type structure means a structure in which the MTJ cell has two layers of the tunneling barriers, and pinned layers each having ferromagnetic alloy or a ferromagnetic multi-layer film including Fe, Ni and Co and a high-coercivity layer including at least one layer of an antiferromagnetic thin film of, e.g., PtMn being laminated is arranged on the outer sides of the two tunneling barriers, whilst a recording layer comprised of ferromagnetic alloy or a multi-layer film including Fe, Ni and CO is arranged in an intermediate layer sandwiched between the two tunneling barriers.

Figure 4A:
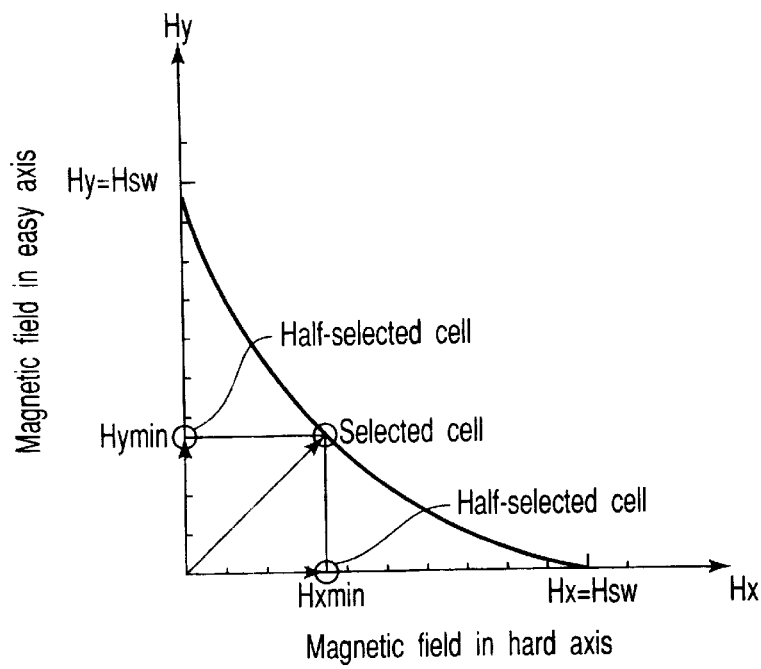
FIG. 4A is a view illustrating a cell selection principle during the writing operation in a conventional cross point method.

The method for writing information in the first embodiment will now be described with reference to FIGS. 4A and 4B. FIG. 4A shows a conventionally utilized writing method and FIG. 4B illustrates a method according to the first embodiment. The prior art example will be first described taking FIG. 4A as an example.

The process of magnetization of a ferromagnetic material having a sub-micron size used for the MRAM can be explained by presuming a single domain model with existence of the uniaxial anisotropy. At this moment, assuming that a threshold value of magnetization inversion (which will be defined as a switching magnetic field Hsw hereinafter) is Hsw, Hsw, the magnetic field in the hard axis Hx and the magnetic field in the easy axis Hy have the following relationship:

$$Hx^{2/3} + Hy^{2/3} = Hsw^{2/3} \quad (2)$$

FIG. 4A shows a part of an asteroid curve typically showing the expression (2).

In the prior art example, orthogonal magnetic fields in the two directions are used, and a value of the unidirectional magnetic field (Hx, Hy) is determined so that the synthetic magnetic field thereof exceeds the threshold value. In the cross matrix type array structure, there exists a half-selected cell which receives the magnetic field in only the hard axis direction or the easy axis direction. If an ideal single domain model is presumed, an erroneous writing margin relative to the half-selected cell is Hx=Hy, which is maximal. Therefore, the writing operation is generally carried out maintaining the condition of Hx=Hy.

Assuming an ideal single domain structure, minimum values Hxmin and Hymin of the unidirectional magnetic fields can be obtained by solving the expression (2) and the following expression:

$$Hx = Hy \quad (3)$$

Also, the following expression can be obtained:

$$Hxmin = Hymin = 2^{-3/2} Hsw \approx 0.35 Hsw$$

The value of the magnetic field is reduced as compared with the case of simply synthesizing a half of the switching magnetic field, i.e., 0.5 Hsw.

The method of the first embodiment will now be described with reference to FIG. 4B.

This embodiment is characterized in that the first writing line and the second writing line run in parallel with each other in the vicinity of the MTJ cell. However, an area in which the first writing line runs in parallel with the second writing line is limited, and the direction of the magnetic field generated by the first writing line actually has a finite angle relative to the magnetic field generated by the second writing line.

Figure 5A:
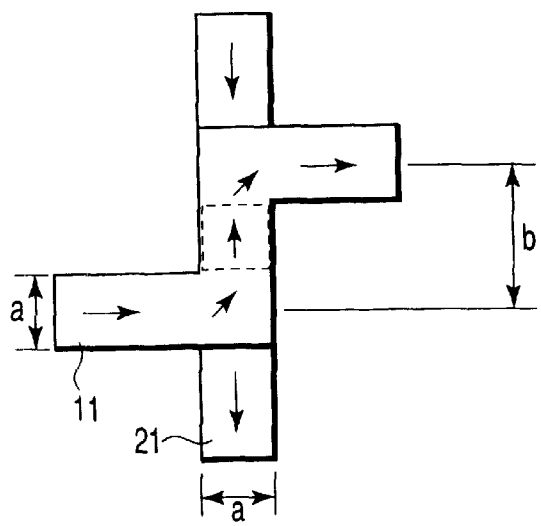
FIGS. 5A to 5C are views typically showing variations of a cross shape of first and second writing lines in the first embodiment.
Figure 5B:
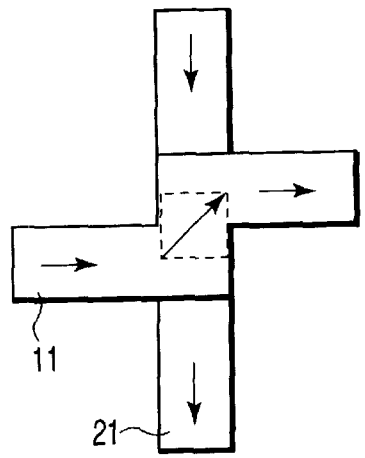
Figure 5C:
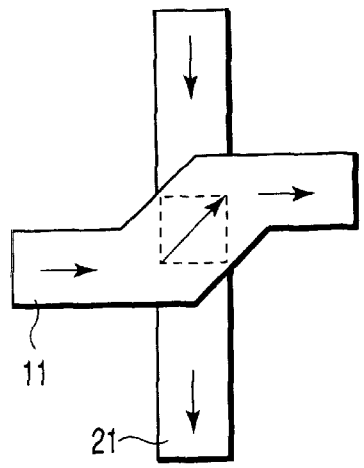

This point will be again explained based on FIGS. 5A to 5C.

That is, as shown in FIG. 5A, the current slantingly flows in an area where the first writing lines is bent. It is understood that the current flows giving priority to an impedance minimum path. Although the flow actually becomes complicated since a current distribution is generated in the wiring, it can be understood that a relative angle of the magnetic fields Hx and Hy generated from the first writing wiring and the second writing wiring is determined by an angle $\theta = \tan^{-1}(b/a)$ defined by a wiring width a and a length of a bent portion b in the first approximation.

In this case, selection of a cell by the magnetic fields obtained from the first and second writing lines is carried out as follows. As shown in FIG. 4B, the magnetic field Hy obtained from the second writing line is parallel with the magnetization easy axis. For example, when an arc having a radius Hxmin is described from an end y=Hymin of the magnetic field Hy, the arc crosses the switching curve represented by the expression (2). That is, the synthetic magnetic field exceeds the switching curve, and inversion of magnetization occurs. As described above, it is good enough to describe the arc having a radius Hx from the end of Hy and determine Hy and Hx in such a manner that the arc crosses the switching curve. The relative angle of Hx and Hy is determined in a range of two intersections of the arc and the switching curves. The erroneous writing margin relative to the half-selected cell becomes maximum when Hx=Hy as similar to the prior art.

In FIGS. 4A and 4B, figures are drawn provided that Hxmin and Hymin have the same length $2^{-3/2}Hxw$. As apparent from FIG. 4B, the arc crosses the switching curve and extends outwards in a range of approximately $\theta = 20$ to $90°$ in the first embodiment, and this figure shows that the writing magnetic field has a margin. The accurate range is given as solutions of the expression (2) and the following expression (4):

$$Hx^2 + (Hy - 2^{-3/2}Hsw)^2 = (2^{-3/2}Hsw)^2 \quad (4)$$

That is, in the first embodiment, the current value required for writing can be reduced as compared with the prior art, and this is a significant advantage of the present invention.

Further, as can be understood from FIG. 4B, the writing current value becomes minimum in the vicinity of a point at which the relative angle of Hx and Hy is 30°–60°. The relative angle which provides the minimum value can be obtained when values of Hx and Hy are determined. Such a relative angle can be controlled by the wiring shape as described above.

FIG. 5B shows an example where the wiring width a and the bent length b are equal to each other and the relative angle is set to approximately 45°. Furthermore, FIG. 5C shows an example in which the bent portion is formed with an angle of inclination 45° in stead of the right angle. The great advantage of the present invention lines in that the optimum writing operation point can be set by controlling the shape of the wiring bent portion in this manner.

When the line width of the two writing lines is a and the bent length (distance between central lines of two parallel lines of the bent line) is b as described above, b=2a in FIG. 5A and b=a in FIGS. 5B and 5C. Since the advantage of the present invention can be obtained if the current path of one of the crossing two writing lines is vertical or somewhat inclined, it is preferable to have the relationship 2a>b>0.

However, the operation with Hx and Hy being parallel with each other is possible by the method for sufficiently making the length of the bent portion longer than the wiring width or the method of using a magnetic shield as will be described later.

(Second Embodiment)

Figure 6:
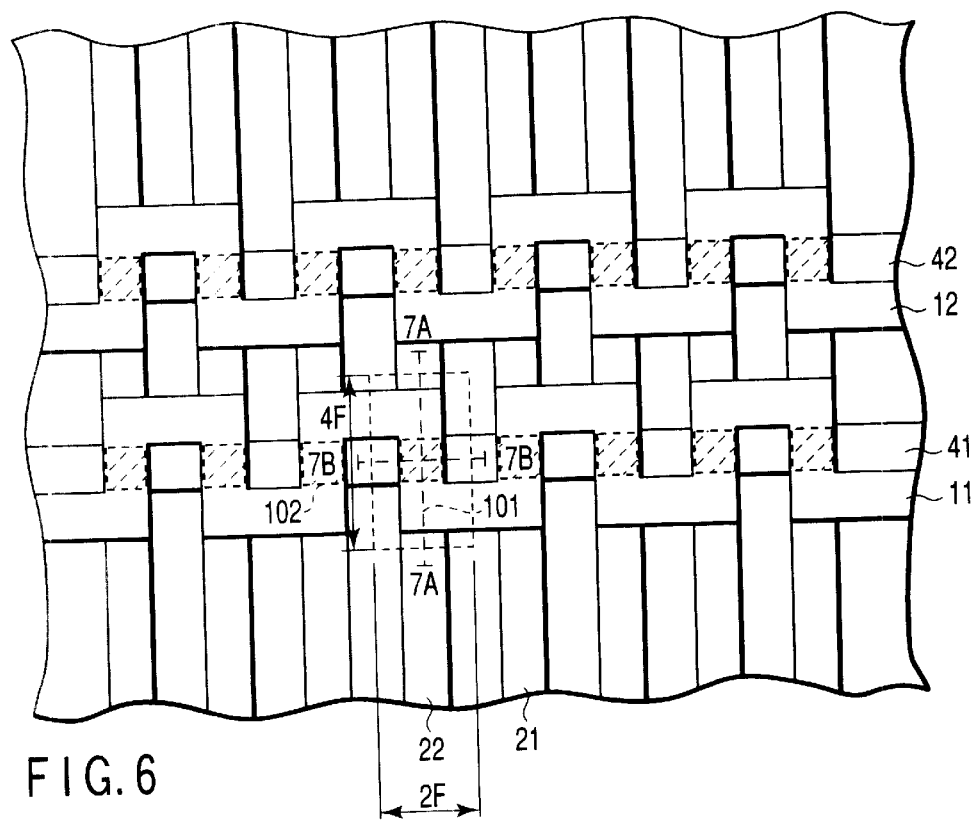
FIG. 6 is a view typically showing a memory cell layout in a second embodiment.
Figure 7A:
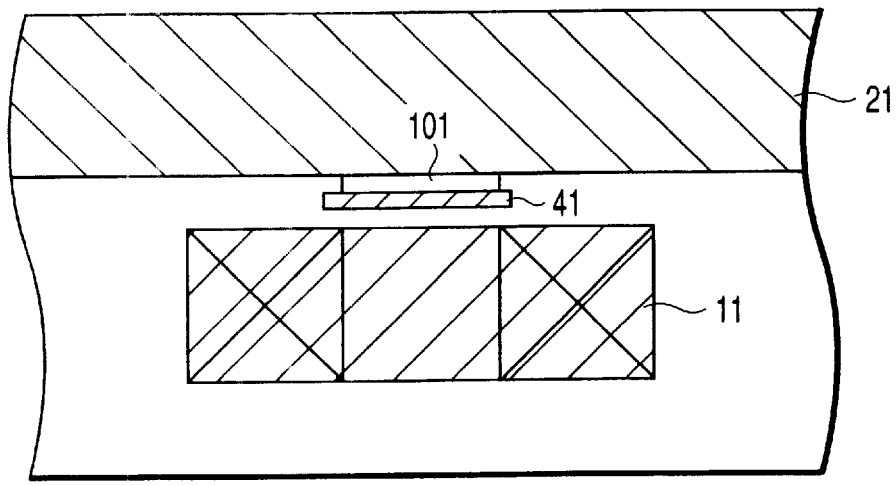
FIG. 7A is a cross-sectional view taken along the line 7A—7A in FIG. 6.
Figure 7B:
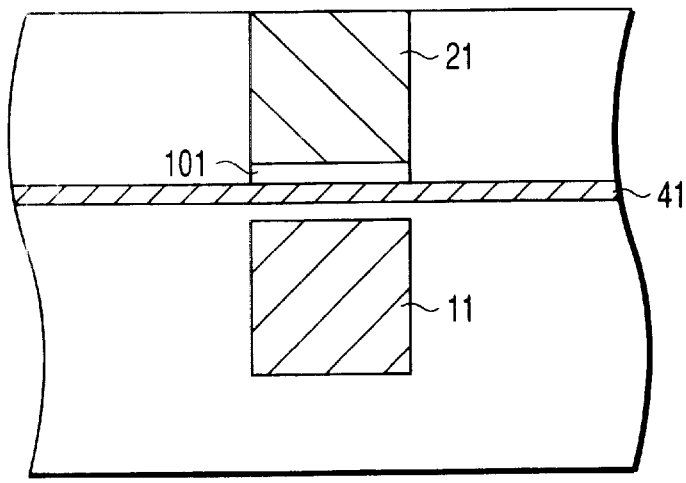
FIG. 7B is a cross-sectional view taken along the line 7B—7B in FIG. 6.

FIG. 6 is a plan view typically showing from a substrate surface side a cell layout according to a second embodiment. FIG. 7A is a cross-sectional view of a memory cell taken along the line 7A—7A in FIG. 6, and FIG. 7B is a cross-sectional view of the memory cell taken along the line 7B—7B. In FIGS. 6 and 7, reference numerals 11 and 12 denote first writing lines; 21 and 22, second writing lines; 101 and 102, MTJ cells; 41 and 42, lower electrode wirings. The first writing line and the second writing line are electrically insulated. Moreover, the second writing line is electrically connected to the MTJ cell and also serves as a data line.

In the second embodiment, a cell selection transistor is not provided, and the MTJ cell is arranged at an intersection of a cross matrix comprised of the second writing line which also serves as the data line and the lower electrode wiring. Although the lower electrode wiring can be eliminated and the MTJ cell can be arranged by, e.g., connecting the first and second writing wirings in the second embodiment, care must be taken to a potential difference between the wirings caused during the writing operation. In such case, it is possible to utilize a method of, e.g., avoiding application of a high voltage by connecting an element which has rectification to the MTJ cell in series or providing rectification to the MTJ cell or the circuit contrivance.

In the second embodiment, both the first writing line and the second writing line are formed to have a width F, and an area of the memory cell becomes $8F^2$. The cell area is more reduced as compared with the first embodiment because formation of a contact from the MTJ cell to the lower semiconductor element is not necessary since the cell selection transistor is not used. It is to be noted that an area of the memory cell also varies depending on a shape of the bent portion. When the length of the bent portion is shortened so as to approximate the relative angle of Hx and Hy to 30°–60°, the cell area is also reduced, which is preferable.

(Third Embodiment)

Figure 8:
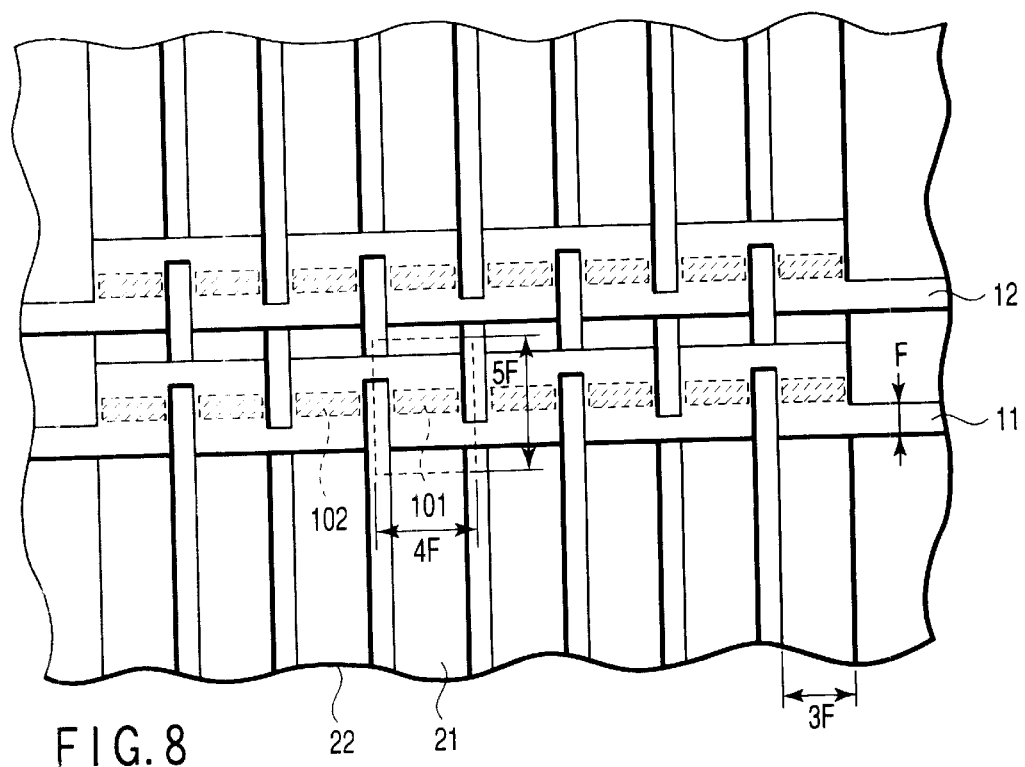
FIG. 8 is a schematic view showing a memory cell layout in a third embodiment.

FIG. 8 is a plan view typically showing a cell layout according to a third embodiment, and rectangular MTJ cells 101 and 102 are used. As similar to the first embodiment, reference numerals 11 and 12 denote first writing lines, and 21 and 22 designate second writing lines.

Since the magnetization easy axis is stabilized along the longitudinal direction of the rectangular ferromagnetic material due to the shape anisotropy, the rectangular ferromagnetic material is preferable to the memory cell application. As an aspect ratio, 1.5 or above is preferable, and approximately 3 to 4 is suitable. It is good enough to design the aspect ratio and the cell shape so as to obtain the desired characteristic of the cell.

In the third embodiment, 3 is presumed as the aspect ratio of the MTJ cell. The second writing line has a width of 3F, and the first writing line has a width of 3F in a parallel area and a width of F in an orthogonal area. An area of the memory becomes $20F^2$.

As in the third embodiment, when wiring formation is carried out by using different widths in the parallel area and the orthogonal area, the cell area can be greatly reduced, which is a preferable conformation.

(Fourth Embodiment)

Figure 9:
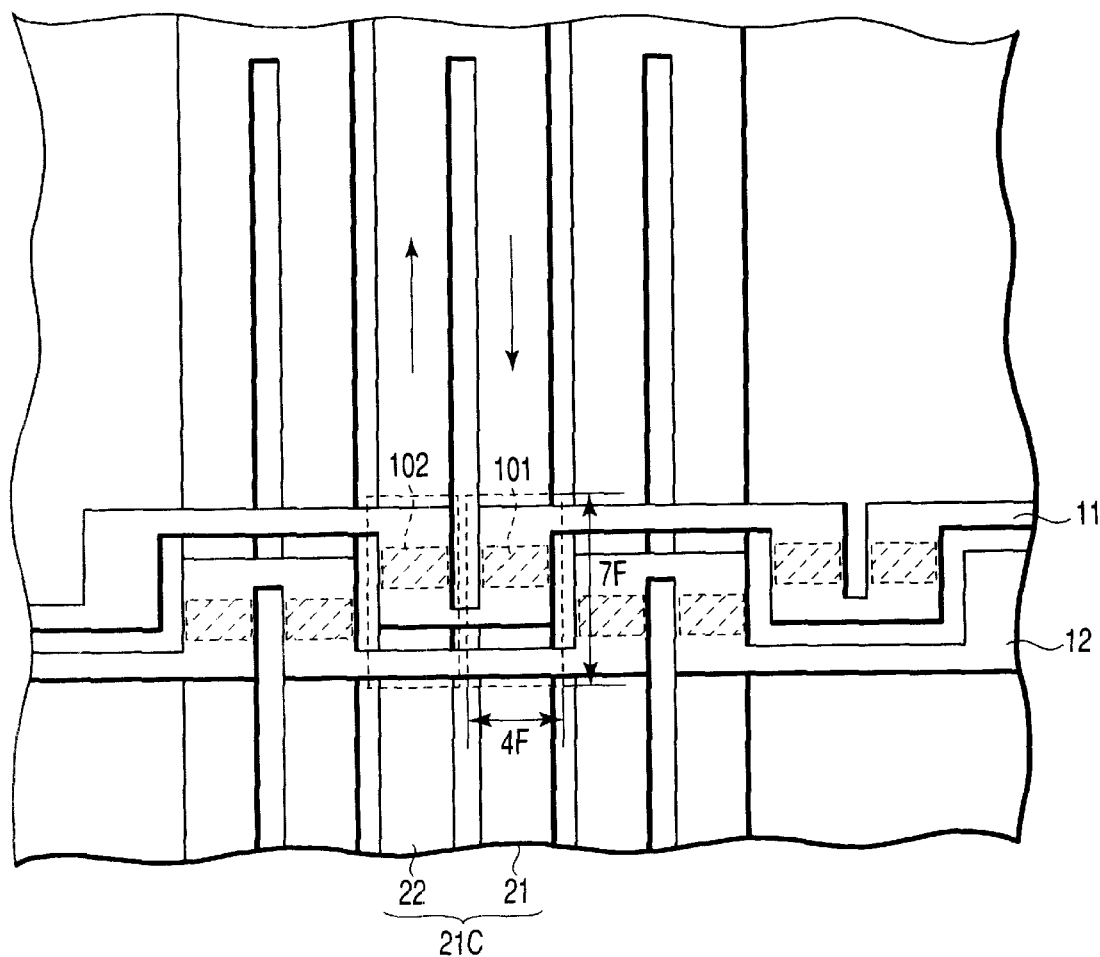
FIG. 9 is a schematic view showing a memory cell layout in a fourth embodiment.

FIG. 9 is a plan view typically showing a cell layout according to a fourth embodiment. The basic cell arrangement in this embodiment is the same as that in the third embodiment. The fourth embodiment is characterized in that one ends of the second writing lines 21 and 22 are connected to each other in the memory cell outer part and a common writing line 21c is thereby formed. In such a structure, by passing the writing electric current to the first writing line 11 and the common writing line 21c, complementary writing can be realized with respect to the MTJ cells 101 and 102.

Incidentally, although the common writing line is formed to the second writing line in the fourth embodiment, it may be formed by using the first writing line. That is, it is good enough that the magnetization directions of the recording layers of the adjacent cells are constantly anti-parallel with each other. Incidentally, it is needless to say that the structure satisfying this condition is included in the present invention without departing from a scope of the invention.

In the fourth embodiment, 3 is presumed as an aspect ratio of the tunneling junction element. The second writing line has a width of 3F and the first writing line has a width of 3F in the parallel area and a width of F in the orthogonal area. An area of a single memory cell becomes $28F^2$.

(Fifth Embodiment)

Figure 10:
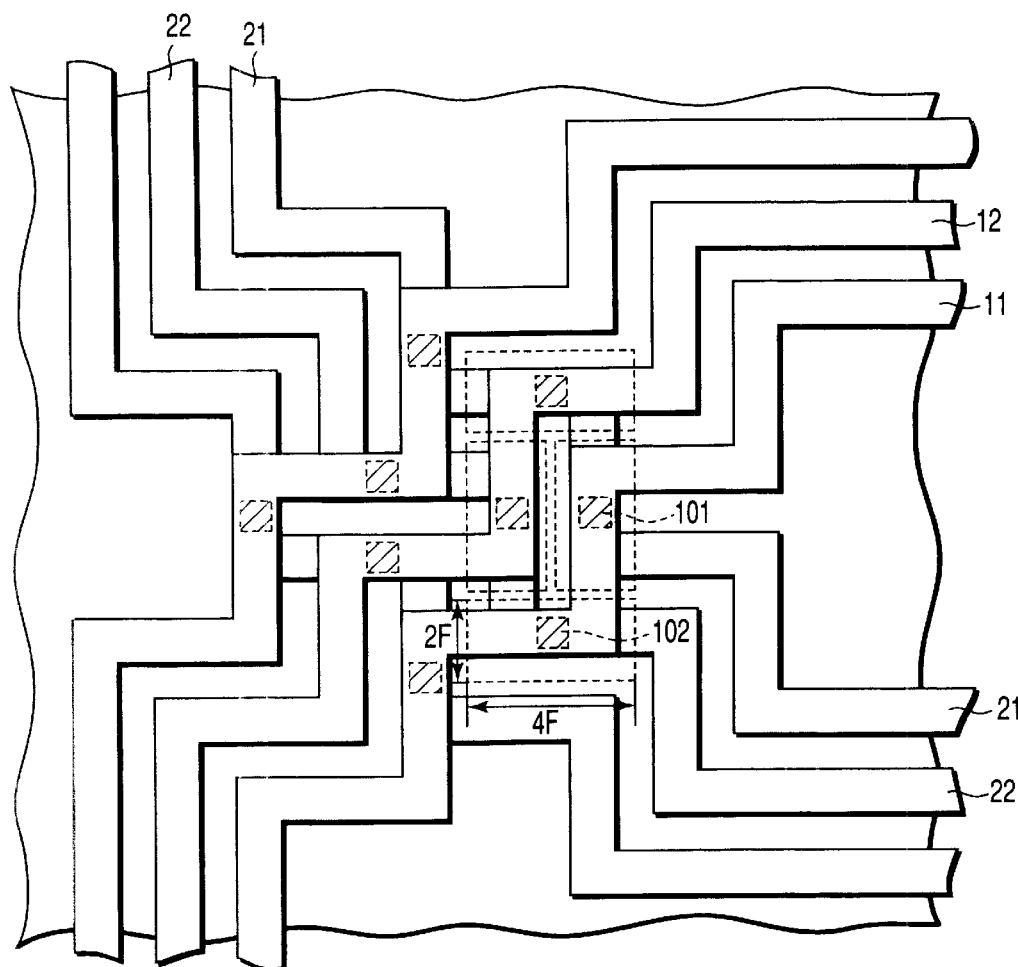
FIG. 10 is a schematic view showing a memory cell layout in a fifth embodiment.

FIG. 10 is a plan view typically showing a cell layout according to a fifth embodiment. The fifth embodiment is characterized in that the first writing line and the second writing line have the same serriform shape and they rotate 90° to cross each other. In the fifth embodiment, there are two types of areas in which the first and second writing lines run in parallel with each other. That is, in the drawing, one is an area defined by a broken line surrounding the MTJ cell 101, and the first writing line and the second writing line run vertically to a lower side of the page space. The other one is an area defined by a broken line surrounding the MTJ cell 102, and the first writing line and the second writing line run in parallel to the lower side of the page space. In the fifth embodiment, the aspect ratio of the MTJ cell is 1, the first and second writing lines have a width of F, and an area of the memory cell becomes $8F^2$.

The magnetization easy axes of the MTJ cells 101 and 102 arranged in different areas must be different from each other by 90°. Although FIG. 10 shows an outside shape of the MTJ cell having the aspect ratio of 1, the fifth embodiment is not restricted thereto. Control over the magnetization easy axis can be readily realized by changing the cell shape as described above. In addition, besides the cell shape, the magnetic coupling relative to a third ferromagnetic film may be utilized, and crystal magnetic anisotropy of the ferromagnetic film constituting the cell may be used.

There are two modes for erroneous writing into the half-selected cell. One is the mode in cases where inversion of magnetization occurs due to the unidirectional magnetic field at the time of half-selection, and this includes a creep phenomenon which can be a problem when inversion of magnetization involving movement of a magnetic wall occurs. In this embodiment, the magnetic field applied to the half-selected cell can be minimized during the writing operation as compared with the prior art, and the erroneous writing margin in this mode can be increased.

On the other hand, the other one is the mode in cases where the half-selected cell can be inverted due to a leakage field from the vicinity of the selected cell. This is, for example, the case that the half-selected cell which senses Hx is inverted due to leak of Hy applied to the selected cell. This is erroneous writing which occurs in a cell closest to the selected cell, and the probability of occurrence of such writing is higher than that in the erroneous writing mode.

In the fifth embodiment, for example, when the MTJ cell 101 is selected, the magnetization easy axis of the half-selected MTJ cell 102 and that of the MTJ cell 101 provided to the first writing wiring 11 are different from each other by 90°. Additionally, the MTJ cells 101 and 102 are arranged with offsets in the directions of x and y. Therefore, the leakage field from the second writing wiring 21 is applied to the half-selected MTJ cell 102 with angles relative to the directions of the magnetization easy axis and the magnetization hard axis. Thus, the effective leakage field value can be lowered, and the erroneous writing margin can be further increased.

Although the first and second writing lines have the same serriform shape in the fifth embodiment, a conformation different from this structure can be also realized. That is, the erroneous writing margin can be increased if it is possible to realize both or either of (1) the fact that the magnetization easy axes of adjacent cells form the relative angle and (2) the fact that adjacent cells have offsets in the directions of x and y. It is needless to say that the structure satisfying this condition is included in the present invention without departing from the scope of the invention.

The first to fifth embodiments have illustrated the example in which the first writing line and the second writing line are arranged so as to be partially parallel to each other at an intersection of the two writing lines, and the erroneous writing margin of the half-selected cell is increased by utilizing the inclination of the electric current path of one zigzag writing line which is formed between itself and the electric current path of the other writing line. In the following sixth to ninth embodiments, description will be given as to an example that the magnetization easy axis of the tunneling junction element is inclined substantially 30°–60° and arranged at the parallel wiring portion and the erroneous writing margin of the half-selected cell is thereby increased.

The essential feature will be first described before explaining the sixth to ninth embodiments. The memory cell used in the magnetic memory device according to these embodiments has at least one tunneling barrier layer, a recording cell having a ferromagnetic tunneling junction having at least two ferromagnetic layers and at least one antiferromagnetic layer, and two writing wirings arranged above and below the recording cell in parallel with each other, and the long axis (magnetization easy axis) direction of the recording cell has an angle of substantially 30°–60° with respect to the two writing wirings. Further, it is desirable that the two wiring wirings are surrounded by a magnetic shield material.

Figure 11:
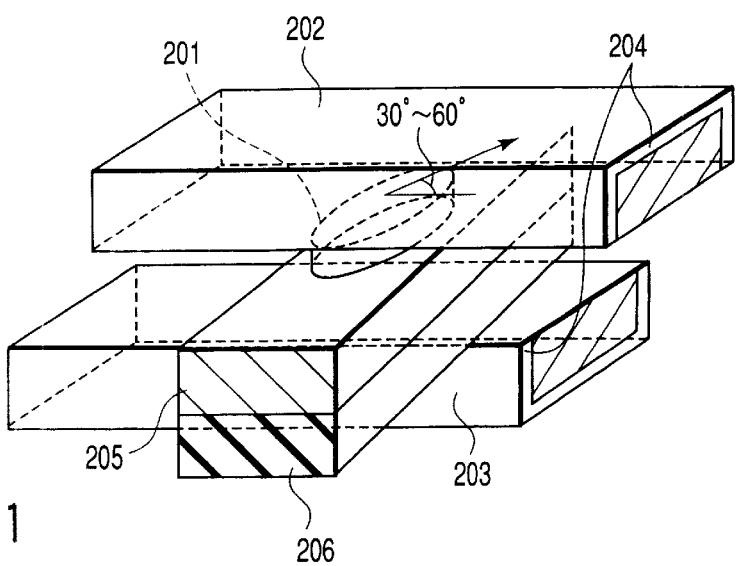
FIG. 11 is a perspective view showing a basic conformation of a magnetic memory element according to sixth to ninth embodiments.

In these embodiment, as shown in FIG. 11, the upper and lower wirings (the bit line 202 and the writing word line 203) of the ferromagnetic tunneling junction (MTJ) cell 201 are arranged in substantially parallel with each other at least at positions above and below the MTJ cell 201, and they are arranged in such a manner that the magnetization easy axis of the MTJ cell 201 is directed toward the direction which is approximately 30°–60° relative to the wiring direction. Furthermore, a shield material 204 is applied to the wirings above and below the MTJ cell of the wirings over the wiring length which is 1.2-fold or above of the longitudinal direction of the MTJ cell. It is to be noted that reference numeral 205 denotes a reading word line orthogonal to the bit line 202, or a wiring connected to a conduction control (switching) element such as a transistor or a diode, and 206 designates an insulation layer which insulates the wiring 205 and the writing word line. The MTJ element 201 is sandwiched and connected between the bit line 202 and the wiring 205.

Figure 12:
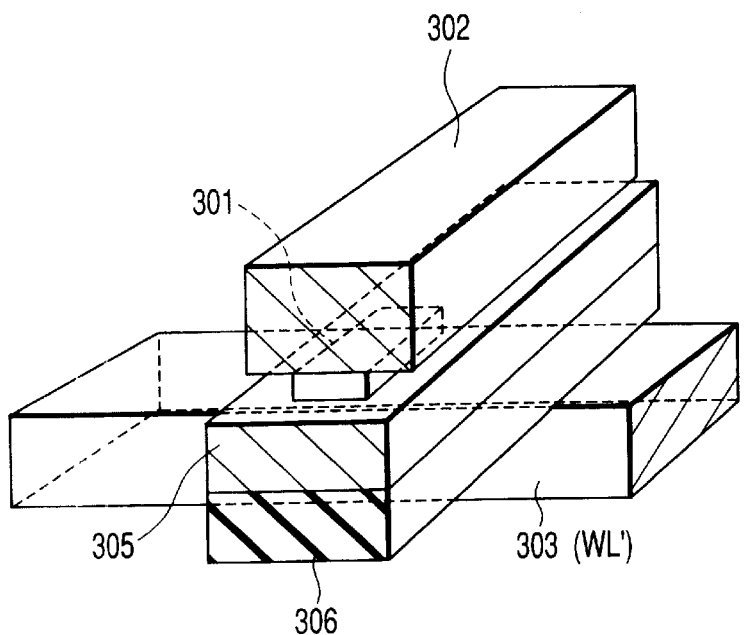
FIG. 12 is a typical perspective view showing the arrangement of MTJ cells in a conventional cross point.

On the other hand, in the prior art magnetic memory element, as shown in FIG. 12, the bit line 302 and the writing word line 303 are orthogonal to each other, and the MTJ cell 301 is sandwiched and connected between the bit line 302 and the wiring 305 in such a manner that the magnetization easy axis of the MTJ cell 301 is directed to the bit line direction. It is to be noted that reference numeral 305 denotes a reading word line, or a wiring connected to a conduction control element such as a transistor or a diode, and 306 designates an insulation layer which insulates the wiring 305 and the writing word line 303.

Figure 13:
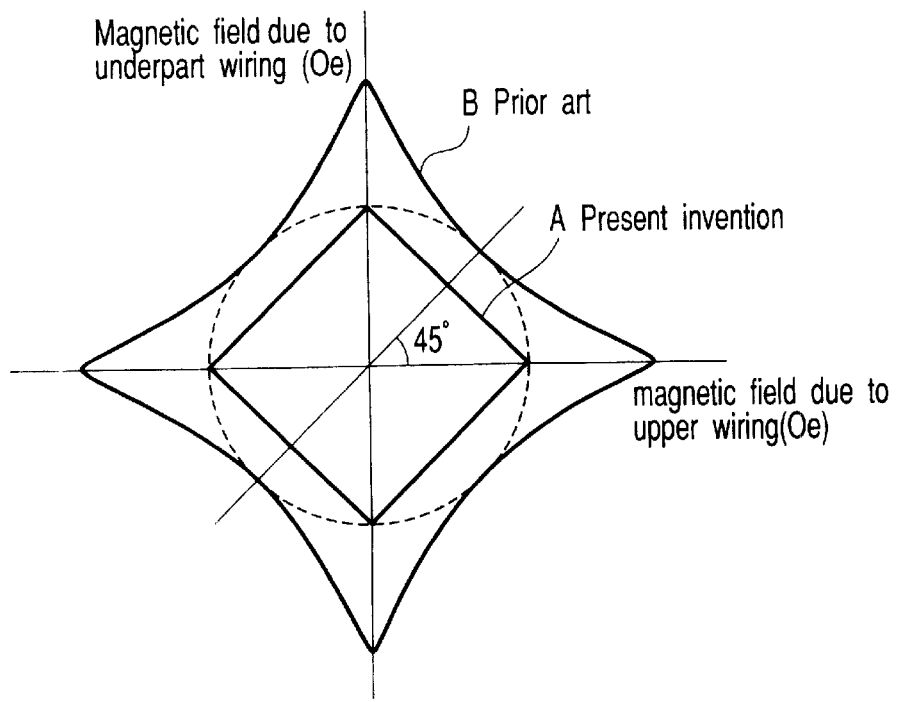
FIG. 13 is a view comparing a switching magnetic field curve (A) obtained when using the basic conformation according to the present invention with a conventional switching magnetic field curve (B)

In case of using the above-described structure, when the pulse currents in opposite directions are caused to flow to the upper and lower parallel wirings, the switching magnetic field curve is deformed as indicated by A in FIG. 13, and writing can be carried out with a smaller magnetic field than that of the prior art asteroid curve B.

In detail, in the conventional cross point architecture such as shown in FIG. 12, the asteroid curve is as indicated by B in FIG. 13. When the magnetic field outside this curve is given, inversion of the spin occurs. As apparent from FIG. 13, when a synthetic magnetic field of the magnetic field generated by the upper wiring and the magnetic field generated by the lower wiring has a direction of 45°, inversion of the spin occurs with the smallest magnetic force. Therefore, when the magnetization easy axis of the MTJ element 201 is inclined by substantially 45° with the bit line 201 and the writing word line 203 being parallel to each other, the switching magnetic field curve can be minimized as indicated by A in FIG. 13.

In case of such a structure, even if the wiring rule is reduced to 0.1 μm and a distance between adjacent cells is decreased, there is no problem of crosstalk since the shield material 204 is applied to the wirings 202 and 203 and the switching magnetic field curve has an advantageous shape with respect to crosstalk.

In case of this structure, it is preferable that the length of the shield material 204 applied to the wirings 202 and 203 is at least 1.2-fold or above of the length of the MTJ cell 201 in the longitudinal direction. When the length of the shield material 204 is longer than this length, the advantage that the shield material 204 reinforces the electric current magnetic field can be provided, and hence the switching magnetic field curve can be decreased in the direction along which the switching magnetic field becomes smaller.

Concrete embodiments which realize the above structure will now be described as the sixth to ninth embodiments.

(Sixth Embodiment)

FIG. 14 is a typical connection diagram showing a structure of a memory cell array (magnetic memory device) according to the sixth embodiment, and the memory cell has an architecture of a simple matrix which does not include a switching element such as a diode or a transistor.

A plurality of bit lines BL (second writing lines) and a plurality of reading word lines WL substantially vertically cross each other, and an MTJ cell 201 is connected between the bit line BL and the reading word line WL at each intersection. A writing word line WL' (first writing line) is provided in parallel with each bit line, and the writing word line WL' and the bit line BL cross each other with an angle of substantially 45 degrees relative to the direction of the easy axis of the MTJ cell. As shown in FIG. 11, a magnetic shield is applied to these bit lines BL and the writing word lines WL'. There are provided a column decoder 211 which selects the reading word line WL and a row decoder 212 which selects the bit line BL and the writing word line WL' outside the memory cell array.

Incidentally, although a number of each of the bit lines BL, the reading word lines WL and the writing word lines WL' is only three in FIG. 14, a desired number of such lines may be provided. This can be similarly applied to the connection diagram in the later-described embodiments.

Since writing is enabled with a smaller magnetic field than that in the prior art when the above-described structure is adopted, power consumption during the writing operation is lowered, and electromigration is also suppressed, thereby providing the memory and the wiring structure having no crosstalk.

Meanwhile, when using this architecture, since the resistance of the MTJ cell must be larger than those of the bit line BL and the writing word line WL', it is preferable that a number of the MTJ cells per block of the memory is not more than 10 Kbit, and more preferably not more than 3 Kbit.

(Seventh Embodiment)

FIG. 15 is a typical connection diagram showing a structure of a memory cell array (magnetic memory device)

according to the seventh embodiment. The memory cell array according to this embodiment has an architecture in which bit lines BL, reading word lines WL crossing the bit lines BL, and writing word lines WL' parallel to the bit lines BL are arranged in the matrix of the memory cell comprised of MTJ cells 201 and diodes 207 each of which is connected to this cell, as similar to the sixth embodiment.

Furthermore, in the seventh embodiment, the magnetization easy axis of the MTJ cell 201 forms an angle of substantially 30–60 degrees relative to the bit line BL and the writing word line WL', and a magnetic shield (not shown) is applied to the bit line BL and the writing word line WL'.

As a result, the advantage similar to that of the sixth embodiment can be obtained, and addition of the diode 207 to the MTJ element 201 in series can realize the active matrix type memory cell array.

(Eighth Embodiment)

Figure 16:
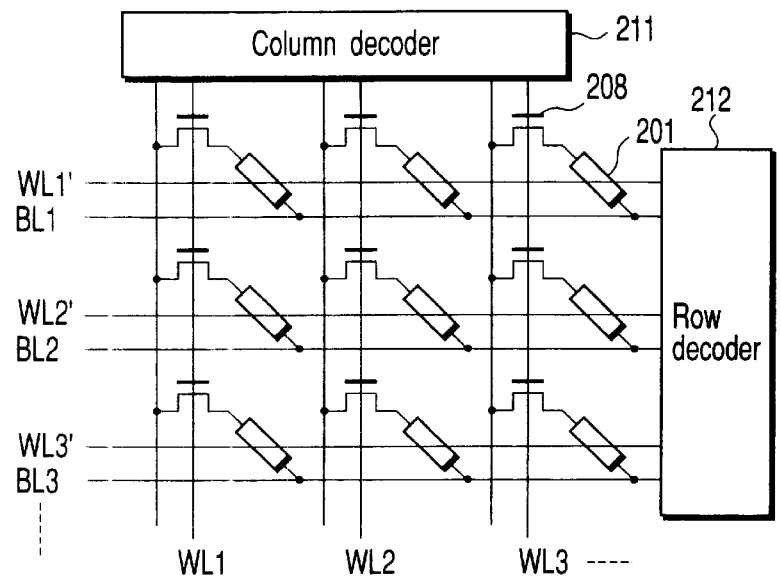
FIG. 16 is a circuit diagram showing an architecture of a magnetic memory device according to the eighth embodiment.

FIG. 16 is a typical connection diagram showing a structure of a memory cell array (magnetic memory device) according to an eighth embodiment. The memory cell array according to this embodiment has an architecture in which bit lines BL, reading word lines WL crossing the bit lines BL, and writing word lines WL' parallel to the bit lines BL are arranged in a matrix of the memory cell comprised of MTJ cells 201 and MOSFETs 208, as similar to the sixth embodiment.

In this architecture, the magnetization easy axis of the MTJ cell 1 likewise forms an angle of substantially 30–60 degrees relative to the bit line BL and the writing word line WL', and a magnetic shield (not shown) is applied to the bit line BL and the writing word line WL'.

As a result, the advantage similar to that of the sixth embodiment can be obtained, and adding the MOSFET 208 to the MTJ element 201 can realize the active matrix type memory cell array.

As a concrete example, description will now be given as to an example in which a test element (TEG1) having the 3×3 cell matrix was fabricated by using the memory cell according to this embodiment comprised of the MOSFETs and the MTJ cells. For the purpose of comparison, a test element (TEG2) having the 3×3 cell matrix structure was fabricated with the architecture of the regular MOSFETs and MTJ cells shown in FTG. 12, and the switching magnetic field characteristics were compared. In regard to wirings, there were used the Al—Cu wiring, the wiring rule of 0.175 $\mu$m, and an aspect ratio of the wiring cross section being 1:2. The wiring whose cross section is longer in the vertical direction than the horizontal direction was used.

The both MTJ cells had an elliptical shape, and the magnetization easy axis of the MTJ cell was inclined approximately 45° relative to the wirings (the bit lines and the writing word lines) in the TEG1 using the structure according to this embodiment (FIG. 11). A shield material was fabricated by the plating method using Ni—Fe. Before film formation of each wiring, plating processing was carried out, and a distance between the MTJ cell and the bit line BL or the writing word line WL' was designed to be nearly same in the both test elements.

In the both test elements, the ferromagnetic double tunneling junction (Ta/Ir—Mn/(CoFe/Ru/CoFe)/AlO$_x$/Ni—Fe/AlO$_x$/(CoFe/Ru/CoFe)/Ir—Mn/Ta) was used for the MTJ cell.

Figure 17:
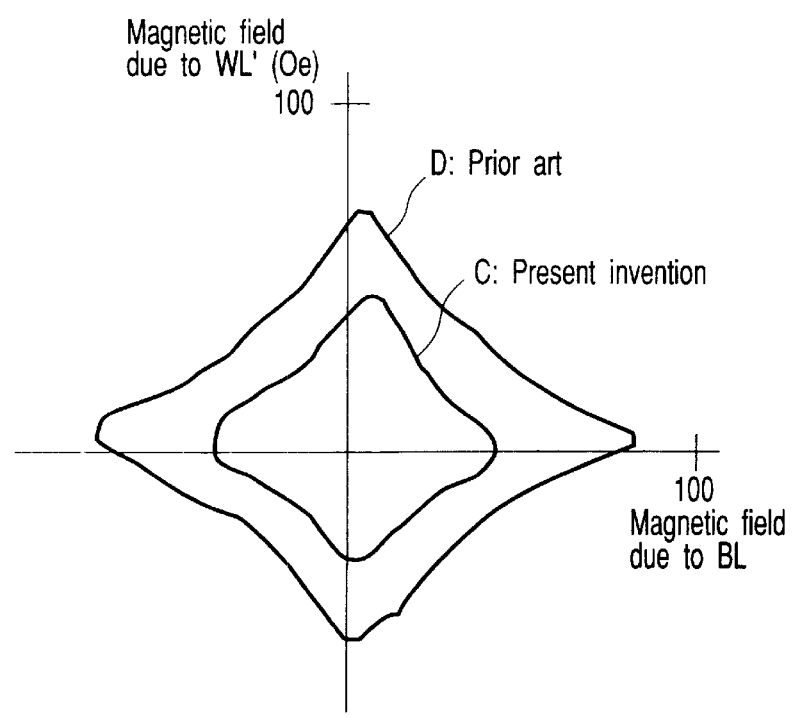
FIG. 17 is a view comparing a switching magnetic field curve (C) of the magnetic memory device according to the eighth embodiment with a conventional switching magnetic field curve (D)

For the MTJ cell, film formation was carried out by using an ultra-high vacuum sputtering device, and AlO$_x$ was fabricated by the method which performs plasma oxidation after film formation of Al. FIG. 17 shows a switching magnetic field curve C when using the architecture of this embodiment, and a switching magnetic field curve D when using a regular architecture illustrated in FIG. 12. As shown in FIG. 17, it was confirmed that the switching magnetic field curve according to this embodiment was considerably minimized and it is possible to provide the memory structure which can reduce power consumption during the writing operation and does not cause a problem of crosstalk and electromigration.

(Ninth Embodiment)

Figure 18:
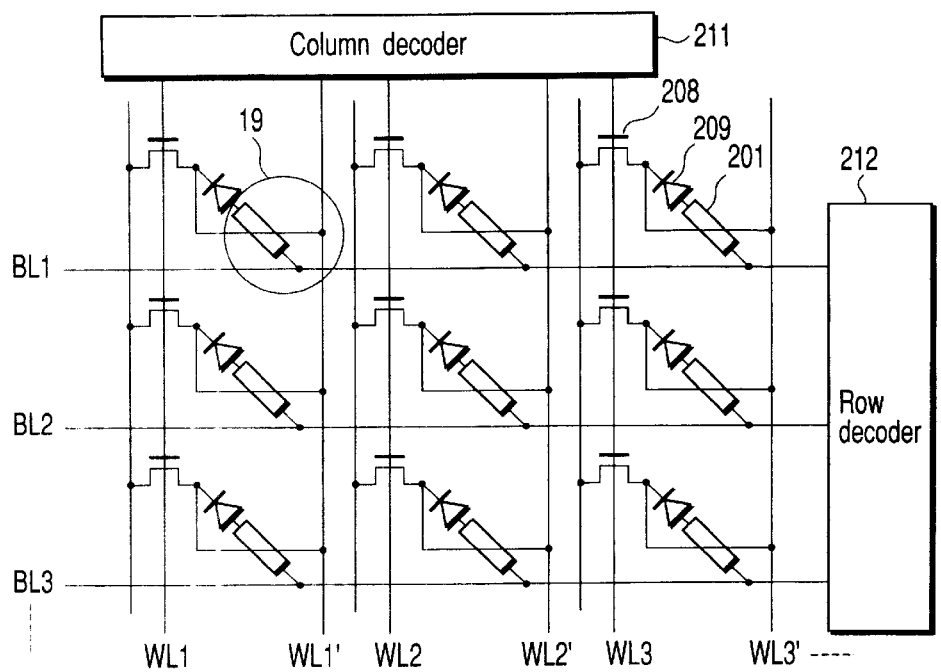
FIG. 18 is a circuit diagram showing an architecture of a magnetic memory device according to the ninth embodiment.

FIG. 18 is a typical connection diagram showing a structure of a memory cell array (magnetic memory device) according to the ninth embodiment. Although the memory cell array according to this embodiment has an architecture in which bit lines BL and reading word lines WL substantially orthogonal to each other are arranged in a matrix of the memory cell comprised of MTJ cells 201 and MOSFETs 208, writing word lines WL' are arranged in parallel to the reading word lines WL, and the bit lines BL and the writing word lines WL' are parallel to each other only at positions where they run above or below the MTJ cells 201.

Figure 19:
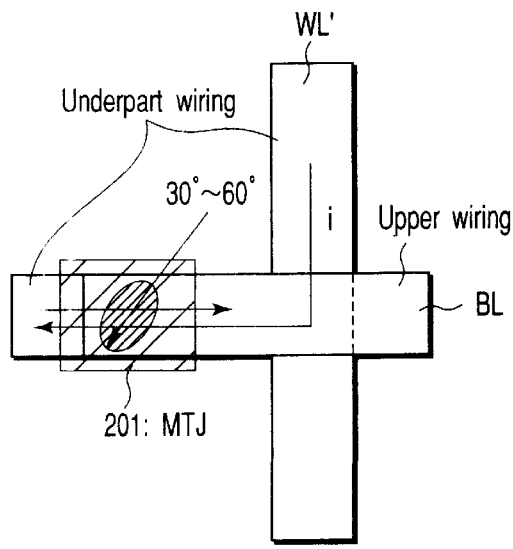
FIG. 19 is a schematic plan view showing the state of an upper wiring, an underpart wiring and an MTJ cell in the ninth embodiment.

FIG. 19 is a typical plan view showing the wiring state of a part 19 in FIG. 18. In this case, the word line WL' is an underpart wiring, and the bit line BL is an upper wiring. Also, the MTJ element 201 is connected to the lower plane of the bit line BL, and the magnetization easy axis of the MTJ element 201 is arranged so as to be inclined approximately 45° relative to the bit line BL and the part of the word line WL' arranged under the bit line BL in the insulating manner.

Figure 20:
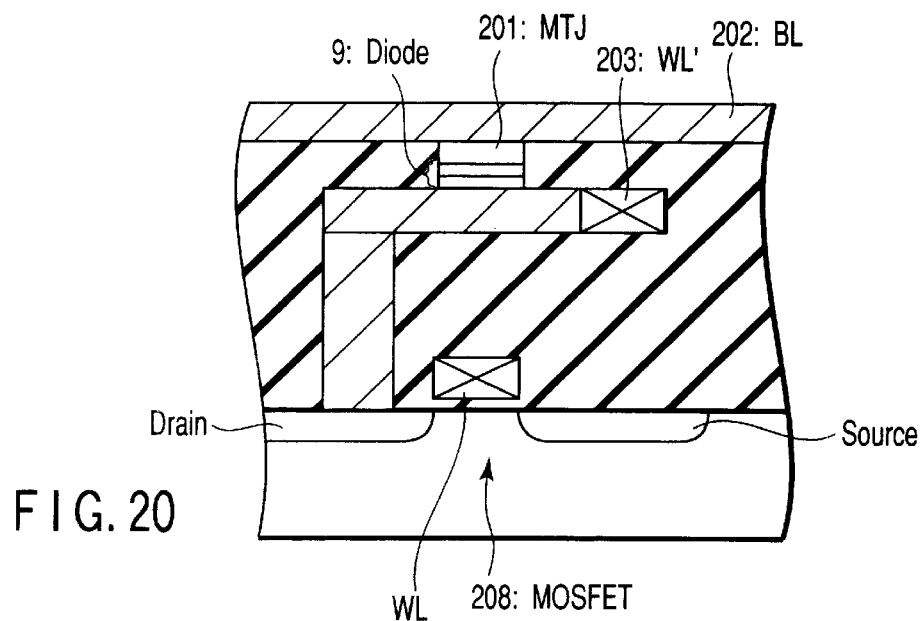
FIG. 20 is a schematic cross-sectional view showing one memory cell in the ninth embodiment.

FIG. 20 is a typical cross-sectional view of the memory cell portion in FIG. 18, and the upper half part of this drawing shows the positional relationship of the upper wiring (BL) and the underpart wiring (WL') illustrated in FIG. 19 in the cross-sectional manner. That is, although the underpart wiring (WL') is arranged vertically to the upper wiring (BL) in the right part in FIG. 20, it is parallel to the upper wiring (BL) in the central part in FIG. 20, and the MTJ cell 201 and the diode 209 are sandwiched between the underpart wiring and the upper wiring.

However, the diode 209 is not necessary when the resistance of the MTJ cell 201 is approximately five times larger than the On resistance of the MOSFET 208. Although not apparent in the cross-sectional view, the MTJ cell 201 is arranged in such a manner that its magnetization easy axis is inclined approximately 45° relative to the upper wiring and the underpart wiring.

If the above-described structure is adopted, the advantage similar to that in the eighth embodiment can be obtained. Also, since wiring the reading word line WL and the writing word line WL' in the same direction can suffice, arrangement of the word line drive circuit (decoder) can be simplified.

In the sixth to ninth embodiments, a column decoder 211 and a row decoder 212 used for selecting the bit line BL, the reading word line WL and the writing word line WL' are arranged around the memory cell array, and "1" or "0" is judged based on whether a signal voltage from the MTJ cell is larger or smaller than that from a reference cell (not shown) arranged for each memory block.

As to a voltage value of the reference cell, it is preferable to use the reference cell having a voltage value which is between a voltage value in the state that arrangement of adjacent spins having a high signal voltage of the MTJ cell is anti-parallel and a voltage value in the state that arrangement of adjacent spins having a small signal voltage is parallel.

As described above, the first to fifth embodiment have disclosed the technique for inclining the synthetic magnetic field obtained from the upper writing line and the lower writing line with respect to the magnetization easy axis and facilitating inversion of magnetization, and the sixth to ninth embodiment have disclosed the technique for arranging the MTJ cell, whose magnetization easy axis is inclined approximately 30–60 degrees, at a parallel portion of the upper writing line and the lower writing line and facilitating inversion of magnetization. In order to further facilitate magnetization inversion, utilization of a yoke or a magnetic bias film can be considered. As the extension of the first to fifth embodiments, embodiments having a yoke or a magnetic bias film added thereto will now be described hereinafter as tenth to 12th embodiments.

(Tenth Embodiment)

Figure 21:
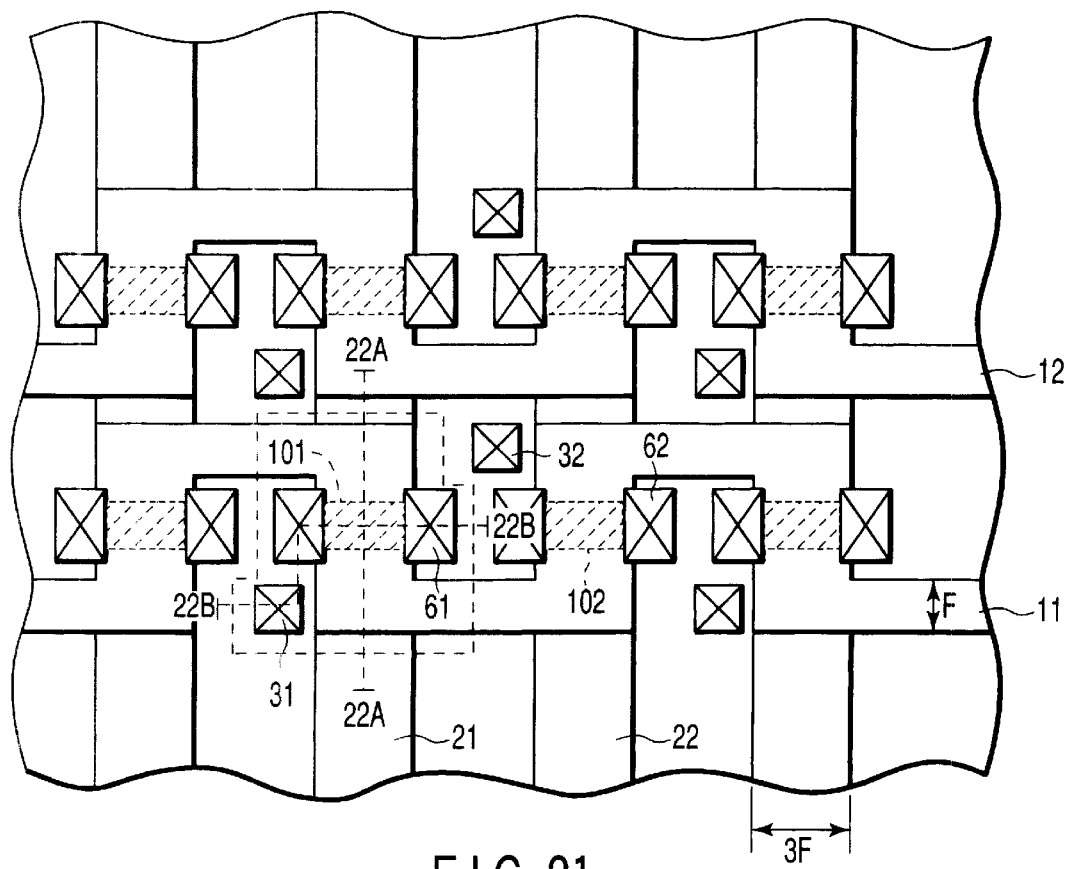
FIG. 21 is a schematic view showing a memory cell layout in a tenth embodiment.

FIG. 21 is a plan view typically showing from a substrate surface side a cell layout according to the tenth embodiment. FIG. 22A is a cross-sectional view of a memory cell taken along the line 22A—22A in FIG. 21, and FIG. 22B is a cross-sectional view of the memory cell taken along the line 22B—22B in FIG. 21. It is to be noted that like reference numerals denote parts equal to those in the first embodiment.

In FIG. 21, reference numerals 11 and 12 denote first writing lines; 21 and 22, second writing lines; 101 and 102, MTJ cells; and 31 and 32, contact holes. Further, in FIGS. 11A and 11B, reference numeral 41 designates a lower electrode; 501 and 502, diffusion areas of selected transistors; and 51, a word line of a selected transistor. The first writing line and the second writing line are electrically insulated. Furthermore, the second writing line is electrically connected to the MTJ element and also serves as a data line.

In FIGS. 21, 22A and 22B, reference numeral 601 denotes a lower magnetic circuit; 602, a magnetic flux guide (yoke); and 603, an upper magnetic circuit. They form magnetic shields 61 and 62.

The basic cell arrangement in the tenth embodiment is the same as that of the third embodiment. In this embodiment, the magnetic shield is applied to the first writing wiring and the second writing wiring in the vicinity of the MTJ cell. The magnetic shield according to this embodiment is configured to converge the magnetic fields obtained from the two wirings to the vicinity of the MTJ element by using the lower magnetic circuit and the upper magnetic circuit respectively and apply the converged magnetic field to this element by using the magnetic flux guide.

The magnetic shield is formed in parallel with the first and second writing lines. The direction of the magnetic field generated from the second writing line is parallel to the magnetization easy axis of the magnetic shield. It is preferable that the length of the magnetic shield is at least 1.5-fold or above of the length of the element in the writing line direction.

As a material used for the magnetic shield, it is possible to use permalloy which is a high-permeability magnetic material, Ni group alloy such as permalloy having Mo added thereto, and Fe group alloy such as Sendust. Also, an oxide ferromagnetic material such as ferrite can be used.

The pulse width of the writing electric current is usually not more than 100 ns during the MRAM writing operation. Therefore, the magnetic shield material must have the characteristic that the magnetization response can follow the writing current pulse. For this purpose, it is desirable to satisfy conditions (1) that the permeability is at least not less than 100 when the magnetic field is just over zero, (2) that saturation magnetization is small and (3) that the specific resistance of the material is high. In order to satisfy these conditions, adding an additive to the alloy, or adding metalloid such as Si or B or an additive from which a grain boundary precipitation such as Cu, Cr or V can be easily produced and forming a microcrystal aggregate or amorphous is a preferable conformation.

Moreover, optimizing the shape is more preferable for the purpose of controlling the magnetic domain in the magnetic shield.

The magnetic shield has advantages of (1) that it can effectively apply the magnetic field generated from the wiring to the MTJ cell in order to converge the magnetic flux generated around the wiring into the magnetic circuit, (2) that the magnetic field of the layer can be reinforced by optimizing the structure in such a manner that the passing magnetic flux of the magnetic circuit can be effectively applied to the vicinity of the element, and (3) that the erroneous writing margin relative to the half-selected cell can be increased since the leakage flux from the wiring can be intercepted by the magnetic circuit. In particular, as with this embodiment, when the MTJ cell is configured to be completely covered with the upper magnetic circuit and the lower magnetic circuit, not only the advantage of (3) can be improved, but also a new advantage that the effect of the magnetic shield can be provided to the external magnetic field. In this case, the external magnetic filed includes the magnetic field from the neighboring wiring.

Figure 23:
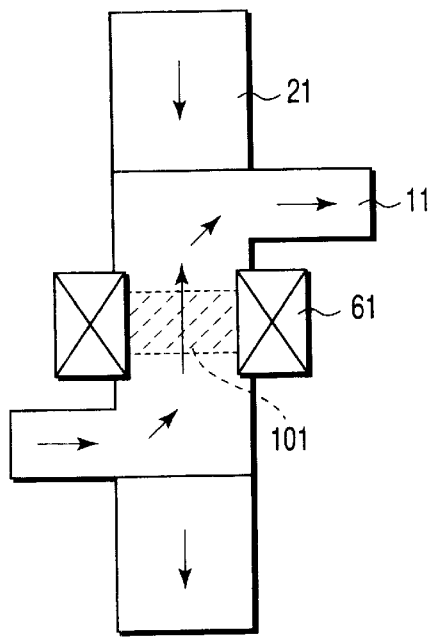
FIG. 23 is a schematic layout view showing a memory cell structure in the tenth embodiment.

In the cell structure according to this embodiment shown in FIG. 23, of the magnetic field Hx generated at the bent portion of the first writing line, a component parallel to the direction of the magnetic field Hy generated by the second writing line is reinforced by the magnetic shield, but a component vertical to Hy is not reinforced by the magnetic shield. That is, the magnetic shield of this embodiment has a function of selecting only a unidirectional component in the magnetic field in an arbitrary direction from the wiring and reinforcing it.

(11th Embodiment)

In the tenth embodiment, since a component in Hx which is parallel to the direction of the magnetic field Hy generated by the second writing line is reinforced, the magnetic field component in the direction of the magnetization hard axis effectively becomes very small. Similarly, when the magnetic field component from the wiring in the direction of the magnetization hard axis is very small, or when the magnetic field component in the direction of the magnetization hard axis does not exist, the operation point setting such as described in the first embodiment is difficult if used as it is.

Figures 24A, 24B:
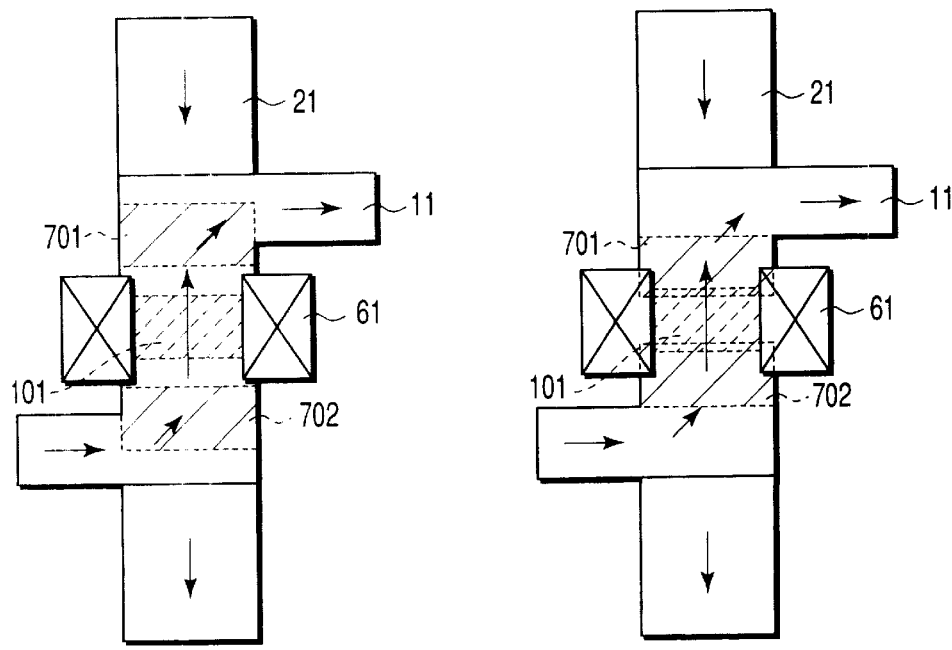
FIGS. 24A and 24B are schematic layout views showing memory cell structures in an 11th embodiment.

In order to improve this problem, as typically shown in FIGS. 24A and 24B, it is effective to arrange bias films 701 and 702 in the vicinity of the MTJ cell 101 and apply the bias magnetic field in the direction of the element hard axis. It is good enough to set the magnetization direction of the bias films 701 and 702 to the direction of the magnetic field which should be applied to the MTJ cell. For example, in order to apply the magnetic field along the hard axis of the MTJ cell, setting the magnetization direction of the bias film so as to be parallel to the magnetization hard axis can suffice.

As to arrangement of the bias films 701 and 702, there are a method to arrange the bias films adjacent to the MTJ cell 101 as shown in FIG. 24A and a method to arrange them so as to overlap the MTJ cell as shown in FIG. 24B.

As to the former method, control is easy since the intensity of the bias magnetic field varies depending on a distance between the MTJ cell 101 and the bias film, but it is hard to increase the intensity of the bias magnetic field.

In regard to the latter method, there can be considered the three cases, i.e., when the MTJ cell 101 is directly connected to the bias films 701 and 702 in the switched manner, when interlayer coupling through a non-magnetic film and an insulation film is provided, and when magnetic coupling is hardly provided. When there is any magnetic coupling between the MTJ cell 101 and the bias films 701 and 702, the intensity of the bias magnetic field can be sufficiently increased, which is advantageous. Further, magnetic domain control caused at an end of the MTJ cell 101 can be effectively carried out.

As the bias film, it is possible to use (1) a high-coercivity magnetic film having higher coercivity than that of the MTJ cell 101 and (2) a soft magnetic film having lower coercivity than that of the MTJ cell 101.

In case of (1), the bias film can be arranged inside the magnetic flux guide 602 forming the magnetic shield 61. In such a case, intensity of the anisotropic magnetic field of the bias film must be sufficiently higher than that of the magnetic field generated in the magnetic flux guide 602.

As such a bias film, for example, it is possible to use hard magnetic alloy such as CoPt alloy or a Co/Pt multi-layer film, a multi-layer film, a multi-layer film having the strong interlayer coupling such as a Co/Cu multi-layer film, a laminated film of an antiferromagnetic material such as PtMn and the hard magnetic alloy, and others. In this case, besides having the large anisotropic magnetic field, sufficiently high saturation magnetization of the film is necessary.

In case of (2), it is difficult to arrange the bias film inside the magnetic flux guide 602 forming the magnetic shield 61, and it must be arranged outside the magnetic flux guide 602. Outside the magnetic flux guide 602, the direction of a line of magnetic force has a component in the direction of the magnetization hard axis because of the influence of the magnetic pole at the end of the magnetic flux guide 602. When such a soft magnetic film as that magnetization inversion is caused to the magnetization hard axis of the MTJ cell due to the component in the magnetization hard axis is used for the bias film, it is possible to provide the effective bias magnetic field in the direction of the hard axis.

As such a bias film, for example, it is possible to use soft magnetic alloy such as NiFe alloy and amorphous alloy. In this case, not only the magnetic field must have the high permeability in the vicinity of zero, but also saturation magnetization of the film must be sufficiently large.

Figure 25:
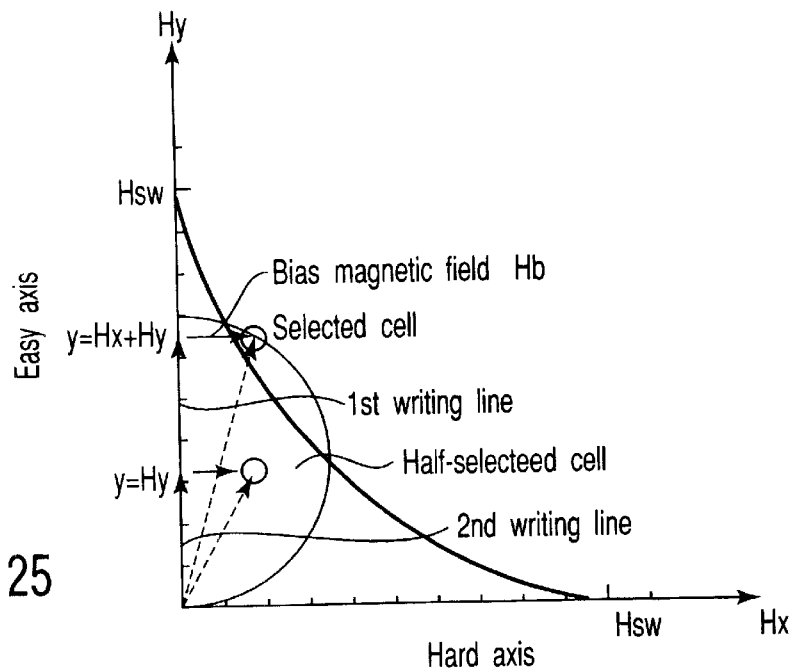
FIG. 25 is a view illustrating a cell selection principle during the writing operation in the 11th embodiment.

Description will be given as to the sell selection operation when such a bias magnetic field is applied with reference to FIG. 25. Here, it is assumed that the generated magnetic fields together with the first and second writing lines are parallel to the magnetization easy axis of the tunneling junction element. As shown in the drawing, in the selected cell, since the magnetic field along the hard axis Hb exists in addition to the magnetic fields Hx+Hy in the direction of the easy axis, the synthetic magnetic field exceeds the switching threshold value. On the other hand, in the half-selected cell, the magnetic field along the easy axis is either Hx or Hy. Also, even if the magnetic field along the hard axis Hb is synthesized, it does not exceed the switching threshold value.

As in this embodiment, when the bias magnetic field is applied by the bias film, the current value required for the writing operation can be reduced. When the current value is reduced, not only power consumption is reduced, but also improvement in the erroneous writing margin of the half-selected cell and improvement in duration of life of the wirings can be expected, thereby increasing the advantage.

(12th Embodiment)

Figure 26:
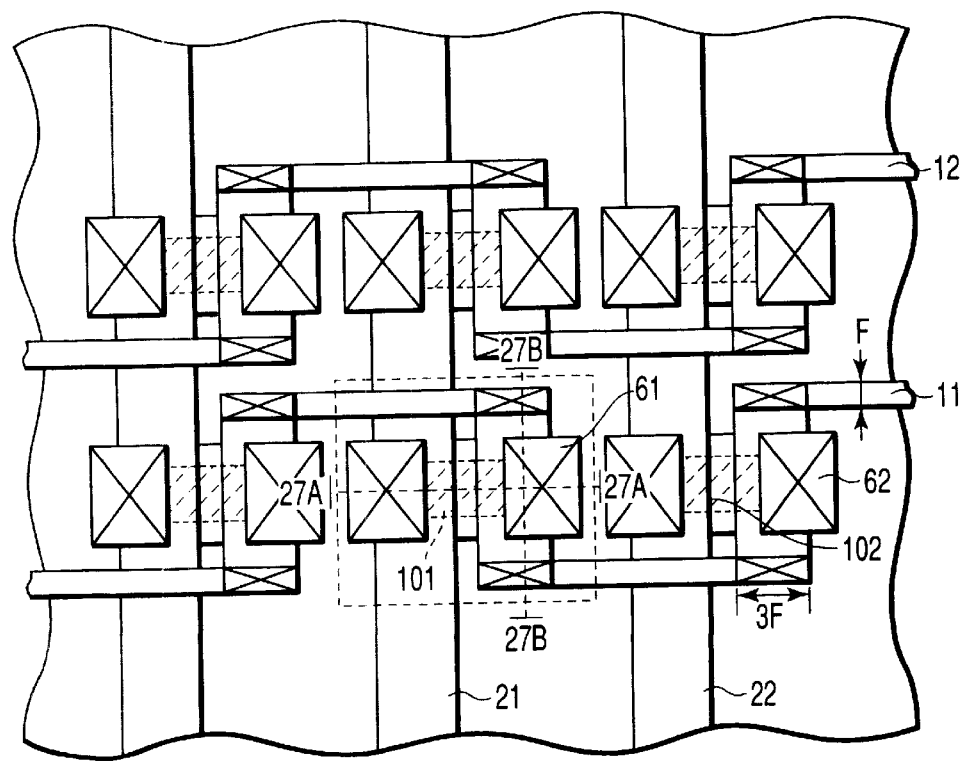
FIG. 26 is a schematic view showing a memory cell layout in a 12th embodiment.
Figure 27A:
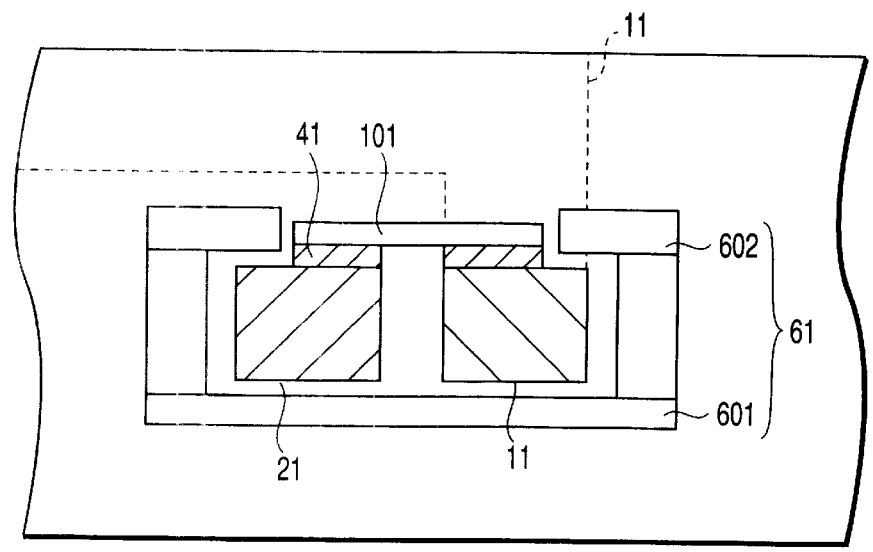
FIG. 27A is a cross-sectional view taken along the line 27A—27A in FIG. 26.
Figure 27B:
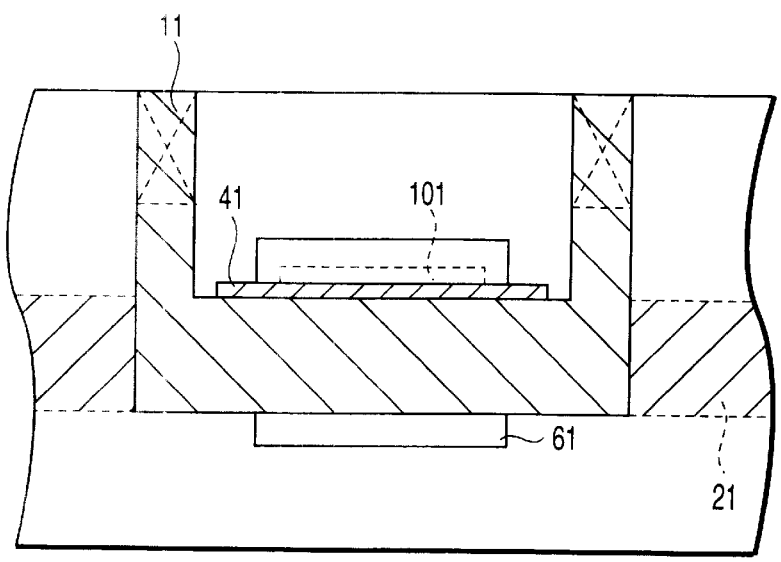
FIG. 27B is a cross-sectional view taken along the line 27B—27B in FIG. 26.

FIG. 26 is a plan view typically showing from the substrate side a cell layout according to the 12th embodiment of the present invention. FIG. 27A is a cross-sectional view of a memory cell taken along the line 27A—27A in FIG. 26, and FIG. 27B is a cross-sectional view of the memory cell taken along the line 7B—7B in FIG. 26.

In FIG. 26, reference numerals 11 and 12 denote first writing lines; 21 and 22, second writing lines; and 101 and 102, MTJ elements. Further, in FIGS. 27A and 27B, reference numeral 41 designates a lower electrode; 601, a magnetic circuit; 602, a magnetic flux guide; and 61 and 62, magnetic shields. The first writing line and the second writing line are electrically connected through to the lower electrode and the MTJ cell, and also serve as sense current circuits with respect to the MTJ cell.

Although the structure of this embodiment is equal to that of the tenth embodiment, it is characterized in that the first writing line and the second writing line are positioned on the same plane in the vicinity of the MTJ cell. This structure is suitable for application to a granular tunneling junction element such that a tunneling current flows substantially in the film plane, or a planar tunneling junction element of, e.g., a lamp edge type.

During the writing operation, although a potential difference occurs between the first and second writing lines, a preferable conformation is that the lower electrode 41 is configured by an element having rectification for the purpose of reducing the influence of a leakage current, destruction of the element or the like.

Description will now be given as to an embodiment of the magnetic memory device in which a soft magnetic bias layer is given to the memory cell having the ferromagnetic tunneling junction including at least one tunneling barrier layer, at least two ferromagnetic layers and at least one antiferromagnetic layer in the direction of the magnetization easy axis of the memory cell.

Figure 28:
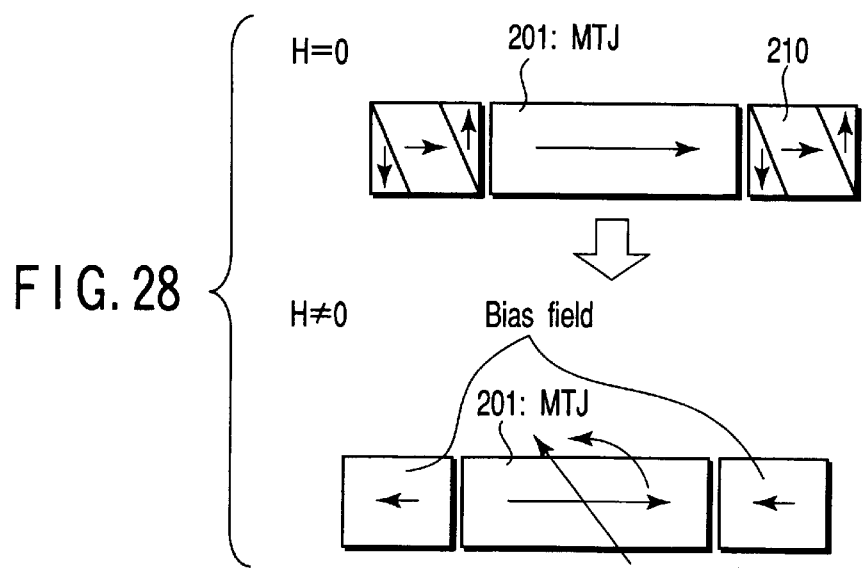
FIG. 28 is a schematic plan view showing a basic conformation of a magnetic memory device including a soft magnetic bias layer.

FIG. 28 is a view showing the MTJ cell from above. In this embodiment, a soft magnetic bias layer 210 is given adjacent to a memory layer of the MTJ cell 201. In the bias layer 210, when the magnetic field does not exist (H=0), an edge domain is generated at the end. However, when the bias magnetic field is given, the spin inverts. In this manner, since the soft bias layer first inverts in accordance with the electric current magnetic field, the switching magnetic field of the MTJ cell 201 becomes small due to the bias magnetic field from the soft magnetic layer.

Figure 29A:
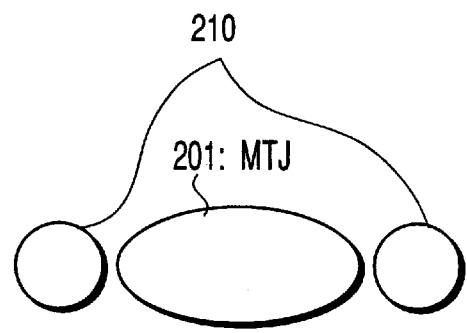
FIGS. 29A to 29D are type drawings showing examples of the cell shape (plan views) of the magnetic memory device including the soft magnetic bias layer.
Figure 29B:
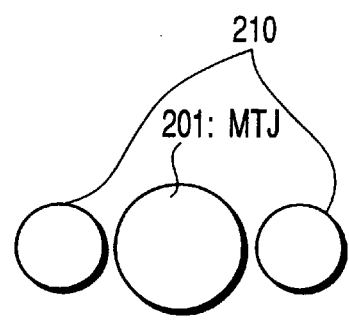
Figure 29C:
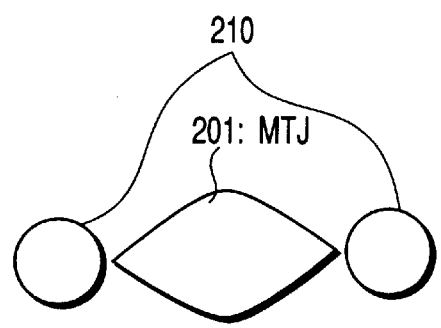
Figure 29D:
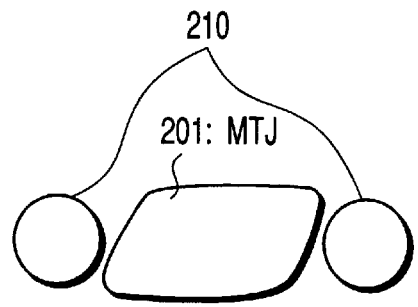

FIG. 21 shows the rectangular MTJ cell shape, and FIG. 11 shows the elliptical MTJ cell shape. However, the cell shape does not have to be rectangular or elliptical. For example, it is possible to employ various cell shapes such as shown in FIGS. 29A to 29D. FIGS. 29A and 29B show examples of the above-described elliptical and circular MTJ cell shapes, and FIGS. 29C and 29D show examples of rhomboidal and parallelogram MTJ cell shapes. Any shape can be used for the soft bias layer. When elliptical, circular, parallelogram and rhomboidal shapes are used, however, the bias magnetic field is effectively applied since the structure is similar to a single magnetic domain structure, and the erroneous operation is reduced. Furthermore, in case of the circular shape, the cell structure becomes minimum, which is preferable.

Moreover, by controlling the soft magnetic layer and the MTJ cell to sub-micron or a smaller unit, the electrostatic magnetic coupling is generated between the MTJ cell and the soft magnetic layer. Therefore, as shown in FIG. 29B, the magnetization easy axis can be defined in the direction of the soft magnetization layer without employing the elongated shape of the MTJ cell 201 as shown in FIG. 29B. Also, since an area of the cell can be reduced, the magnetic memory device with the higher capacity (MRAM) can be manufactured. In such structures, the circular structure shown in FIG. 29B demonstrates the minimum switching magnetic field.

In addition, when the sixth to ninth embodiments are combined and used, the switching magnetic field becomes minimum. In such a case, it is preferable to incline the axial direction connecting the soft bias layers to the direction of approximately 45° relative to the wiring direction. A 13th embodiment is such an example.

(13th Embodiment)

In the 13th embodiment, a test element (TEG3) of the 3×3 cell matrix having the eighth element (FIG. 16) structure including the MTJ cell 1 and the MOSFET having the FIG. 29B structure and a test element (TEG4) of the 3×3 cell matrix structure according to the eighth embodiment (FIG. 16) having the simple elliptical MTJ cell were manufactured, and their switching magnetic field characteristics were compared.

In regard to a wiring, an Al—Cu wiring was used, and it was determined the wiring rule is 0.25 $\mu$m and the cross-sectional aspect ratio of the wiring is 1:2. In addition, the wiring whose cross section is longer in the vertical direction than the horizontal direction was used. In the both test elements, the magnetization easy axis of the MTJ cell is inclined to the direction of 45° with respect to the wirings (the bit line BL and the writing word line WL'). Ni—Fe was used as a shield material, and the CVD method was employed for manufacturing. Before film formation of each wiring, CMP processing was carried out, and a distance between the MTJ cell and the bit line BL or the writing word line WL' was designed to be equal in the both test elements. As the MTJ cell, the ferromagnetic double tunneling junction (Ta/Ni—Fe/Pt—Mn/(CoFe/Ru/CoFe)/AlOx/(Co—Fe—Ni/Cu/Co—Fe—Ni)/AlOx/(CoFe/Ru/CoFe)/Pt—Mn/Ta) was used in the both test elements.

Figure 30:
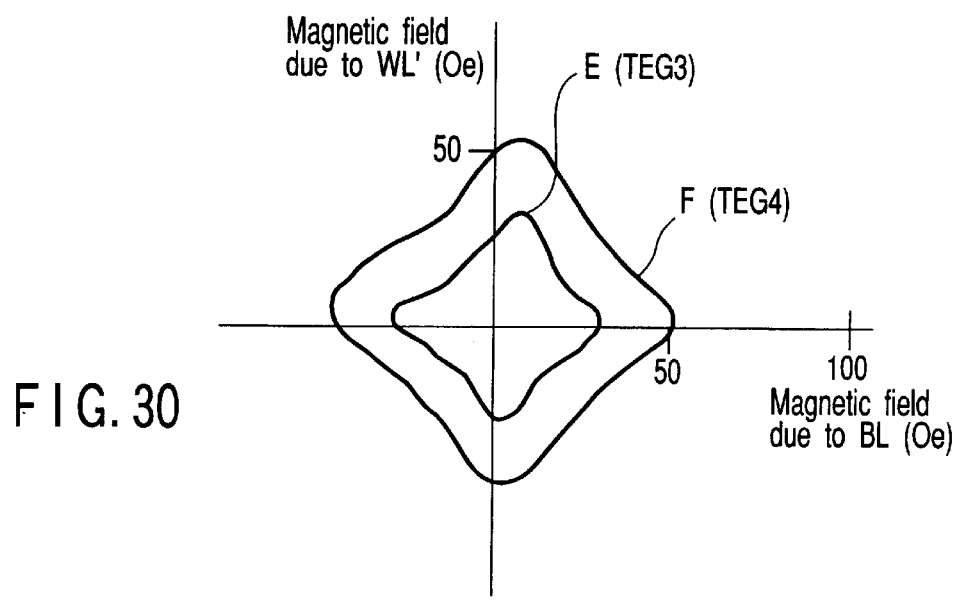
FIG. 30 is a view comparing a switching magnetic field curve (E) of a magnetic memory device according to a 13th embodiment with a switching magnetic field curve (F) of the magnetic memory device according to the eighth embodiment.

Film formation of the MTJ cell 201 was performed by using an ultra-high vacuum sputtering device, and $AlO_x$ was manufactured by the method which effects plasma oxidation after forming a film of Al. FIG. 30 shows the switching magnetic field curves when using the architecture (TEG3) according to the 13th embodiment (E) and when using the structure (TEG4) according to the eighth embodiment (F). As illustrated in FIG. 30, the switching magnetic field curve according to the eighth embodiment is considerably reduced as compared with the eighth embodiment. As a result, power consumption during the writing operation is decreased, and it was confirmed that a memory structure which does not generate problems of crosstalk and EM can be provided.

Incidentally, although description has been given as to the example of the combination of the eighth embodiment and the soft magnetic bias layer in the 13th embodiment, the combination is not restricted to the eighth embodiment, and the soft magnetic bias layer can be combined with the first to seventh and ninth embodiments.

The magnetic memory device described in connection with the first to 13th embodiments is preferable to be mounted in a memory portion of, e.g., a mobile phone.

Figure 31:
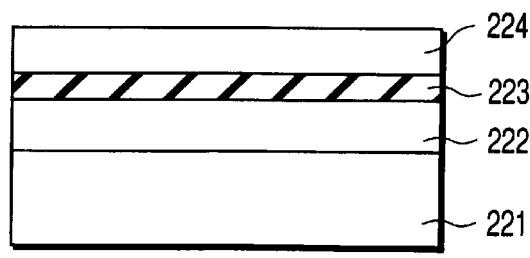
FIG. 31 is an element cross-sectional view showing an example of the layer structure of an MTJ cell used in the embodiments according to the present invention.
Figure 32:
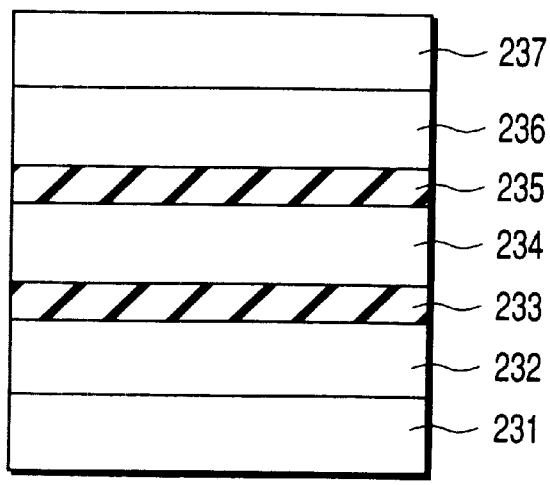
FIG. 32 is an element cross-sectional view showing another example of the layer structure of the MTJ cell used in the embodiments according to the present invention.

Incidentally, in the first to 13th embodiments, as the MTJ element (cell) structure, it is preferable to adopt a so-called spin valve type which provides the antiferromagnetic layers 221 and 231 as shown in FIGS. 31 and 32. Incidentally, in FIG. 31, reference numerals 222 and 224 denote ferromagnetic layers and 223 designates a tunneling barrier layer, and this drawing shows the tunneling junction structure having at least one tunneling barrier layer, at least two ferromagnetic layers and at least one antiferromagnetic layer. Additionally, in FIG. 32, reference numerals 232, 234 and 236 denote ferromagnetic layers; 233 and 235, tunneling barrier layers; and 231 and 237, antiferromagnetic layers.

Figure 33:
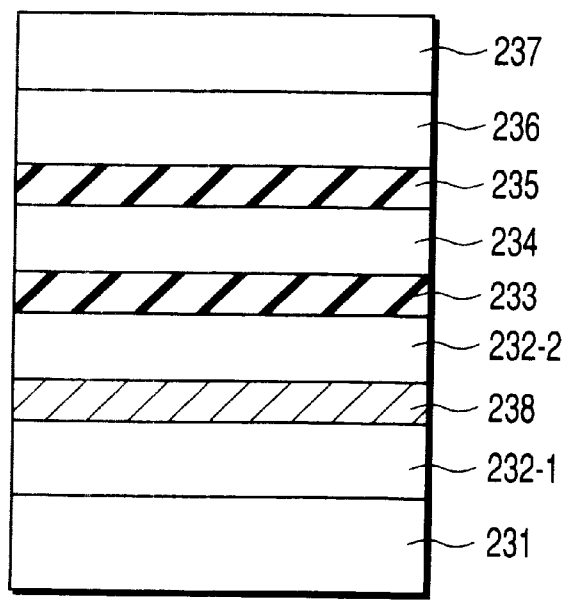
FIG. 33 is an element cross-sectional view showing still another example of the layer structure of the MTJ cell used in the embodiments according to the present invention.

Further, the ferromagnetic layer (magnetically pinned layer) 232 can be, as shown in FIG. 33, substituted by a so-called antiferromagnetic coupling layer in which the three-layer structure of (the ferromagnetic layer 232-1/the nonmagnetic layer 238/the ferromagnetic layer 232-2) realizes the antiferromagnetic coupling through the nonmagnetic layer.

Since the spin of the pinned layer can be further strongly fixed by using this three-layer structure as the pinned layer, there can be obtained merits that some magnetic moments of the pinned layer are caused to rotate due to writing for several times and the output is gradually lowered and that a film thickness of the antiferromagnetic film can be reduced and the forming accuracy can be increased, thereby reducing irregularities in the switching magnetic field.

Furthermore, it is preferable to use the three-layer structure of (the ferromagnetic layer/the nonmagnetic layer/the ferromagnetic layer) for the magnetic recording layer. In this case, it is preferable to provide the ferromagnetic layer coupling between the ferromagnetic layers. When this structure is used for the magnetic recording layer, the dependency of the switching magnetic field on the cell width is small, and increase in the switching magnetic field is small even if the cell width is reduced, which increases the capacity of the MRAM. Also, even if the cell width of the MTJ element is reduced, there is no problem of increase in power consumption or electromigration of the wirings during the writing operation, thus manufacturing the MRAM with the higher capacity. The smaller intensity of the ferromagnetic coupling is preferable, and the switching magnetic field becomes smaller as the intensity is lowered.

In this embodiment, elements and types of the ferromagnetic layer are not restricted in particular, and it is possible to use Fe, Co, Ni, or alloy of such materials, magnetite having the high spin polarizability, oxides such as $CrO_2$, $RXM_nO_{3-y}$ (R: rear earth, X: Ca, Ba, Sr), Heusler alloy such as NiMnSb, PtMnSb, or a magnetic semiconductor such as Zn—Mn—O, Ti—Mn—O, $CdMnP_2$, $AnMnP_2$.

The ferromagnetic layer used in the embodiments according to the present invention must have a film thickness such that the superparamagnetism is not provided, and it is preferable that the film thickness is not less than 0.4 nm. Further, if the film thickness is very large, the switching magnetic field and the magnetostatic leakage field become large. Therefore, the film thickness should be preferably not more than 3.0 nm. Furthermore, even if a nonmagnetic element such as Ag, Cu, Au, Al, Mg, Si, Bi, Ta, B, C, O, N, Pd, Pt, Zr, Ir, W, Mo or Nb is included in these magnetic materials to a certain degree, this can be allowed as long as the ferromagnetism is not lost.

As the antiferromagnetic film, it is possible to use Fe—Mn, Pt—Mn, Pt—Cr—Mn, Ni—Mn, Ir—Mn, Ru—Mn and others. In case of using the three-layer film of the ferromagnetic layer/the nonmagnetic layer/the ferromagnetic layer for a free (recording) layer, Cu, Au, Ru, Ir, Rh, Ag and others can be used for the nonmagnetic layer.

As the dielectric material or the insulating layer, it is possible to use various dielectric materials such as $Al_2O_3$, $SiO_2$, MgO, AlN, AlON, GaO, $Bi_2O_3$, $SrTiO_2$, $AlLaO_3$ and others. Oxygen or nitrogen may be lost to a certain degree in these materials.

It is preferable that a thickness of the dielectric layer depends on a junction area of the MTJ element and is not more than 3 nm. A substrate material is not restricted to a specific type in particular, and Si, $SiO_2$, $Al_2O_3$, AlN or the like can be manufactured on the substrate. It is preferable to use as an underlying layer and a protection layer, Ta, Ti, Pt, Au, Ti/Pt, Ta/Pt, Ti/Pd, Ta/Pd or the like on the substrate.

Such a magnetoresistive element (MTJ element) can be manufactured by using a regular thin film forming device which adopts various kinds of sputtering methods, evaporation methods, molecular beam epitaxy methods or the like.

As described above, according to the present invention, it is possible to provide the high-density magnetic memory device which can greatly reduce power consumption during the writing operation and eliminate problems of the conventional magnetic memory device (MRAM), that is, large power consumption, crosstalk, electromigration (EM) and others.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A magnetic memory device comprising:
   a plurality of magnetoresistive elements arranged on a first plane in rows and columns;
   a plurality of first writing lines arranged adjacent to said magnetoresistive elements on a second plane different from said first plane;
   a first address decoder which selects a desired one from said plurality of first writing lines;
   a plurality of second writing lines crossing said plurality of first writing lines on a third plane different from said second plane, and having parts adjacent to said plurality of magnetoresistive elements and parallel to said plurality of first writing lines; and
   a second address decoder which selects a desired one from said plurality of second writing lines.

2. The magnetic memory device according to claim 1, wherein said plurality of magnetoresistive elements are respectively provided directly above said plurality of first writing lines, each of said magnetoresistive elements has at least two ferromagnetic layers and at least one tunneling barrier layer therebetween, and a magnetization easy axis thereof has an angle of substantially 30°–60° relative to said plurality of first writing lines; and
   at least one of said plurality of first and second writing lines are connected to said plurality of magnetoresistive elements.

3. The magnetic memory device according to claim 2, wherein said plurality of first writing lines and said plurality of second writing lines have a plurality of magnetic shields which intercept influence of an external magnetic field at least in the vicinity of said plurality of magnetoresistive elements.

4. The magnetic memory device according to claim 1, further comprising a plurality of high-coercivity magnetic films configured to apply a bias magnetic field to said plurality of magnetoresistive elements.

5. The magnetic memory device according to claim 1, further comprising:
   a plurality of magnetic circuits which hold magnetic fields generated from said plurality of first writing lines and said plurality of second writing lines; and
   a plurality of magnetic flux guides which concentrate magnetic fluxes passing through said plurality of magnetic circuits on said plurality of magnetoresistive elements.

6. The magnetic memory device according to claim 1, wherein said plurality of first writing lines and said plurality of second writing lines are arranged on planes different from a plane where said plurality of magnetoresistive elements are arranged to sandwich said plurality of magnetoresistive elements therebetween in a direction vertical to said first plane.

7. The magnetic memory device according to claim 1, wherein in said parts said plurality of second writing lines are arranged on the same plane as said plurality of first writing lines.

8. The magnetic memory device according to claim 1, wherein selection is carried out by giving column and row addresses of a selected element to said first address decoder and said second address decoder, respectively, and data is selectively written into said plurality of magnetoresistive elements.

9. The magnetic memory device according to claim 1, wherein each of said plurality of magnetoresistive elements has at least two ferromagnetic layers and at least one tunneling barrier layer therebetween, and said at least one layer of ferromagnetic layers comprises a laminated layer including a three-layer structure of a ferromagnetic layer/a nonmagnetic metal layer/a ferromagnetic layer.

10. The magnetic memory device according to claim 1, further comprising:
    a plurality of word lines for reading which cross a plurality of bit lines, said bit lines comprising said plurality of either first or second writing lines; and
    switching elements which are provided at respective intersection regions of said plurality of bit lines and said plurality of word lines and connected to said magnetoresistive elements in series.

11. A magnetic memory device comprising:
    a first writing line arranged on a first plane;
    a second writing line arranged on a second plane different from said first plane and has a first part extended from one direction vertical to said first writing line, a second part connected to said first part at one end portion thereof and overlaps said first writing line, and a third part connected to said second part at the other end portion thereof, and extended vertically to said first writing line on an opposite side of said first part, the relationship of 2a>b>0 being provided wherein a is a line width of said first and said second writing line and b is a shortest distance between a central line of said first part and a central line of said third part of said second writing line; and
    a magnetoresistive element sandwiched between said first writing line and said second part of said second writing line and connected to either said first writing line or said second writing line.

12. The magnetic memory device according to claim 11, further comprising a high-coercivity magnetic film configured to apply a bias magnetic field to said magnetoresistive element.

13. The magnetic memory device according to claim 11, further comprising:
    a magnetic circuit which holds magnetic field generated from said first writing line and said second writing line; and
    a magnetic flux guide which concentrates magnetic fluxes passing through said magnetic circuit on said magnetoresistive element.

14. The magnetic memory device according to claim 11, wherein said first writing line and said second writing line are arranged on planes different from a plane where said magnetoresistive element is arranged to sandwich said magnetoresistive element therebetween in a direction vertical to said first plane.

15. The magnetic memory device according to claim 11, further comprising:

a plurality of first writing lines in units of said first writing line;

a plurality of second writing lines in units of said second writing line;

a plurality of magnetoresistive elements in units of said magnetoresistive element;

a first address decoder which selects a desired one from said plurality of first writing lines; and a second address decoder which selects a desired one from said plurality of second writing lines, wherein selection is carried out by giving column and row addresses of a selected element to said first address decoder and said second address decoder, and data is selectively written into said plurality of magnetoresistive elements.

16. The magnetic memory device according to claim 11, wherein each of said magnetoresistive elements has at least two ferromagnetic layers and at least one tunneling barrier layer therebetween, and at least one layer of said ferromagnetic layers comprises a laminated layer including a three-layer structure of a ferromagnetic layer/a nonmagnetic metal layer/a ferromagnetic layer.

17. A magnetic memory device comprising:

a plurality of ferromagnetic tunneling junction elements arranged in a matrix form on a first plane and each of which has at least two ferromagnetic layers including a magnetic recording layer and at least one tunneling barrier layer therebetween; and a plurality of soft magnetic bias layers provided at both ends of said plurality of ferromagnetic tunneling junction elements in a direction of a magnetization easy axis and having magnetism softer than said magnetic recording layer.

18. The magnetic memory device according to claim 17, wherein at least one layer of said ferromagnetic layers comprises a laminated layer including a three-layer structure of a ferromagnetic layer/a nonmagnetic metal layer/a ferromagnetic layer.

19. The magnetic memory device according to claim 17, further comprising:

a plurality of first writing lines arranged on a second plane different from a first plane, on which said plurality of ferromagnetic tunneling junction elements are formed, adjacent to said ferromagnetic tunneling junction elements; and a plurality of second writing lines crossing said first writing lines on a third plane different from said second plane and having parts adjacent to said plurality of ferromagnetic tunneling junction elements and parallel to said plurality of first writing lines.

20. The magnetic memory device according to claim 17, further comprising:

a plurality of word lines for reading which cross a plurality of bit lines, said bit lines comprising said plurality of either first or second writing lines; and switching elements provided at respective intersection regions of said plurality of bit lines and said plurality of word lines and connected to said ferromagnetic tunneling junction elements in series.

* * * * *